United States Patent
Nishikawa et al.

(10) Patent No.: US 11,277,142 B2
(45) Date of Patent: Mar. 15, 2022

(54) PHASE CORRECTING DEVICE, DISTANCE MEASURING DEVICE, PHASE FLUCTUATION DETECTING DEVICE AND PHASE CORRECTION METHOD

(71) Applicants: Kabushiki Kaisha Toshiba, Tokyo (JP); Toshiba Electronic Devices & Storage Corporation, Tokyo (JP)

(72) Inventors: Masaki Nishikawa, Yokohama Kanagawa (JP); Shoji Ootaka, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/018,078

(22) Filed: Sep. 11, 2020

(65) Prior Publication Data
US 2021/0281267 A1    Sep. 9, 2021

(30) Foreign Application Priority Data
Mar. 4, 2020   (JP) .............................. JP2020-036649

(51) Int. Cl.
*H03L 7/14*    (2006.01)
*H03L 7/085*   (2006.01)
(Continued)

(52) U.S. Cl.
CPC ............ *H03L 7/146* (2013.01); *G01S 7/4008* (2013.01); *G01S 13/345* (2013.01); *H03L 7/085* (2013.01)

(58) Field of Classification Search
CPC ....... H03L 7/146; H03L 7/085; G01S 7/4008; G01S 13/345
See application file for complete search history.

(56) References Cited

U.S. PATENT DOCUMENTS 4,107,679 A * 8/1978 Strauch ................. G01S 13/341
                                                    342/122
4,219,770 A * 8/1980 Weinert ................. G01N 22/00
                                                    324/615
(Continued)

FOREIGN PATENT DOCUMENTS

JP    10-39009 A    2/1998
JP    4407769 B2    2/2010
(Continued)

*Primary Examiner* — Adam D Houston
(74) *Attorney, Agent, or Firm* — Allen & Overy LLP

(57) ABSTRACT

A phase correcting device includes a local oscillator configured to give a local oscillation signal to a device configured to detect a phase of an inputted signal, a first phase detector configured to detect a phase of the local oscillation signal to output the phase of the local oscillation signal, a reference phase device configured to generate a quasi-reference phase corresponding to a reference phase of the local oscillation signal at a time of an initial setting of the local oscillator to output the quasi-reference phase, based on a reference clock, a second phase detector configured to detect a fluctuation amount of a phase of the local oscillator, based on the phase detected by the first phase detector and the quasi-reference phase, and a correction circuit configured to correct the phase of the inputted signal by using a detection result of the second phase detector.

11 Claims, 21 Drawing Sheets

(51) Int. Cl.
*G01S 7/40* (2006.01)
*G01S 13/34* (2006.01)

(56) References Cited

U.S. PATENT DOCUMENTS

| | | | | |
|---|---|---|---|---|
| 7,068,110 B2* | 6/2006 | Frey | ............... | H03L 7/0891 |
| | | | | 327/147 |
| 7,332,972 B2* | 2/2008 | Vandel | ............... | H03L 7/0893 |
| | | | | 331/17 |
| 7,529,533 B2* | 5/2009 | Bellantoni | ............... | H04B 1/30 |
| | | | | 455/334 |
| 7,834,804 B2 | 11/2010 | Nakanishi | | |
| 8,339,165 B2* | 12/2012 | Dunworth | ............... | H03L 7/0891 |
| | | | | 327/152 |
| 8,937,572 B2* | 1/2015 | Kobayashi | ............... | H03L 7/093 |
| | | | | 342/199 |
| 8,982,974 B2* | 3/2015 | Bogdan | ............... | H04L 27/2675 |
| | | | | 375/260 |
| 10,305,611 B1* | 5/2019 | Rimini | ............... | G01S 13/343 |
| 2005/0258908 A1* | 11/2005 | Mitric | ............... | H03L 7/143 |
| | | | | 331/16 |
| 2007/0153951 A1* | 7/2007 | Lim | ............... | H03L 7/085 |
| | | | | 375/376 |
| 2008/0233954 A1* | 9/2008 | Ibrahim | ............... | H03L 7/181 |
| | | | | 455/434 |
| 2009/0256601 A1* | 10/2009 | Zhang | ............... | H03L 7/089 |
| | | | | 327/156 |
| 2010/0245160 A1 | 9/2010 | Sakurai et al. | | |
| 2012/0242538 A1* | 9/2012 | Hasch | ............... | G01S 7/354 |
| | | | | 342/194 |
| 2014/0162573 A1* | 6/2014 | Laskar | ............... | H04W 52/0209 |
| | | | | 455/73 |
| 2015/0318860 A1* | 11/2015 | Wang | ............... | H03L 7/0891 |
| | | | | 327/157 |
| 2016/0020775 A1* | 1/2016 | Kuo | ............... | H03L 7/095 |
| | | | | 327/159 |
| 2018/0254882 A1* | 9/2018 | Bogdan | ............... | H03L 7/0995 |
| 2018/0267154 A1* | 9/2018 | Ootaka | ............... | G01S 13/36 |
| 2018/0267155 A1* | 9/2018 | Shimizu | ............... | G01S 7/4912 |
| 2019/0227141 A1* | 7/2019 | Nishikawa | ............... | G01S 13/84 |
| 2020/0114875 A1* | 4/2020 | Stitt | ............... | H04B 17/318 |
| 2020/0309941 A1* | 10/2020 | Makari | ............... | H04W 4/48 |
| 2021/0078537 A1* | 3/2021 | Ootaka | ............... | B60R 25/30 |
| 2021/0088646 A1* | 3/2021 | Ootaka | ............... | G01S 13/38 |
| 2021/0281267 A1* | 9/2021 | Nishikawa | ............... | G01S 13/345 |
| 2021/0297083 A1* | 9/2021 | Nishikawa | ............... | G01S 7/2923 |

FOREIGN PATENT DOCUMENTS

| | | |
|---|---|---|
| JP | 2010-237172 A | 10/2010 |
| JP | 2018-155724 A | 10/2018 |
| WO | 2008-072481 A1 | 6/2008 |

* cited by examiner

PHASE CORRECTING DEVICE, DISTANCE MEASURING DEVICE, PHASE FLUCTUATION DETECTING DEVICE AND PHASE CORRECTION METHOD

CROSS REFERENCE TO RELATED APPLICATION

This application is based upon and claims the benefit of priority from the prior Japanese Patent Application No. 2020-036649 filed in Japan on Mar. 4, 2020; the entire contents of which are incorporated herein by reference.

FIELD

An embodiment described herein relates generally to a phase correcting device, a distance measuring device, a phase fluctuation detecting device and a phase correction method.

BACKGROUND

In recent years, keyless entry systems that make it easy to lock and unlock cars have been adopted by many automobiles. According to the technique, a user of an automobile can lock and unlock doors by using communication between a key of the automobile and the automobile. Further, in recent years, a smart key system that allows a user to lock and unlock a door or start an engine without touching a key has also been widely used.

However, there have been many cases where an attacker who carries out a so-called relay attack invades the communication between a key and an automobile, and steals a vehicle or articles in the vehicle. Therefore, as a defense measure against the aforementioned attack (so-called relay attack), a measure for measuring the distance between the key and the automobile, and prohibiting the control of the vehicle by communication when the distance is determined to be a predetermined distance or more is being studied.

There are a time detection method, a frequency difference detection method, a phase detection method and the like, as distance measurement methods, but due to the ease of implementation, a distance measuring system is receiving attention which employs a communication type phase detection method that obtains the distance between respective devices by communication between the respective devices. However, since reference signals between the respective devices independently operate, the initial phases differ from each other, and therefore distance measurement accuracy is generally greatly deteriorated in the communication type phase detection method. Therefore, there is proposed the technique that enables distance measurement by transmitting phase information detected in one device to the other device. According to the proposal, it is possible to calculate a highly accurate distance by performing a predetermined operation by using phase information of the signals detected by receiving units of two distance measuring devices that form a pair.

Note that in the proposal, accurate distance measurement is made possible on the precondition that the initial phase does not fluctuate in the local oscillator in the distance measuring device.

Since the distance measuring device is also mounted on a key side, there is a demand for extending the battery life of the key, and low power consumption of the distance measuring device is required. Since most of the power consumption of the distance measuring device is consumed by wireless units, reduction in power consumption of the wireless units is required. The power consumption of the wireless units strongly depends on the architecture of the wireless units. A configuration using a voltage-controlled oscillator (VCO) direct modulation method (hereinafter, also referred to as a VCO direct modulation method) for a transmission unit, and a super-heterodyne (SH) method (hereinafter, also referred to as an SH method) or a Low-IF reception method for a reception unit is widely known as a configuration of low power consumption. Therefore, it is desired to realize a distance measuring device by the configuration using a VCO direct modulation method for the transmission unit, and using an SH method for the reception unit.

However, when distance measurement is performed by using a VCO direct modulation method for the transmission unit, and using an SH method for the reception unit, the initial phase fluctuates in the local oscillator in the distance measuring device. Therefore, accurate distance measurement cannot be performed with the distance measuring device using a VCO direct modulation method for the transmission unit, and using an SH method for the reception unit.

Note that the fluctuation of the initial phase in the local oscillator may have an adverse effect on not only the distance measuring device but also various devices that detect the phases of the signals inputted by using the local oscillator.

DETAILED DESCRIPTION

A phase correcting device of an embodiment includes a local oscillator that includes a PLL configured to generate a local oscillation signal based on a reference clock, and is configured to give the local oscillation signal to a device configured to detect a phase of an inputted signal, a first phase detector included in the PLL, and configured to detect a phase of the local oscillation signal to output the phase of the local oscillation signal, a reference phase device configured to generate a quasi-reference phase corresponding to a reference phase of the local oscillation signal at a time of an initial setting of the local oscillator to output the quasi-reference phase, based on the reference clock, a second phase detector configured to detect a fluctuation amount of a phase of the local oscillator, based on the phase detected by the first phase detector and the quasi-reference phase, and a correction circuit configured to correct the phase of the inputted signal by using a detection result of the second phase detector.

Hereinafter, the embodiment of the present invention will be described with reference to the drawings.

Embodiment

Figure 1:
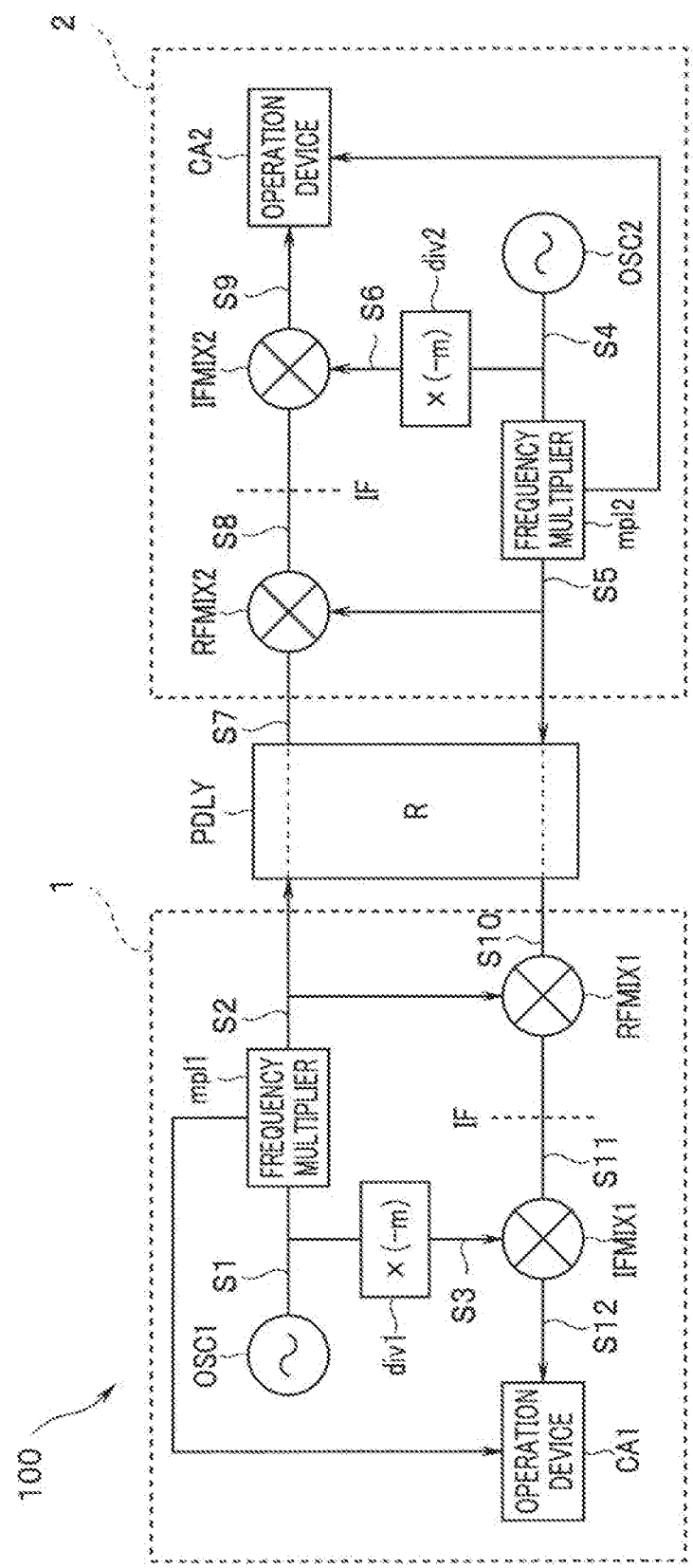
FIG. 1 is a block diagram illustrating a distance measuring system configured by distance measuring devices each including a phase fluctuation detecting device and a phase correcting device according to an embodiment.

FIG. 1 is a block diagram illustrating a distance measuring system configured by distance measuring devices each including a phase fluctuation detecting device and a phase correcting device according to the embodiment. Distance measurement obtaining a distance between a device 1 and a device 2 is made possible by performing transmission and reception of a single wave signal between the devices 1 and 2 in FIG. 1. Note that the single wave signal is a signal of a single frequency such as an unmodulated carrier.

In the present embodiment, an example in which the phase fluctuation detecting device and the phase correcting device are applied to the distance measuring device is explained, but it is also possible to apply the phase fluctuation detecting device and the phase correcting device to various devices that detect phases of inputted signals other than the distance measuring device. For example, application to a positioning device is also possible.

Figure 2:
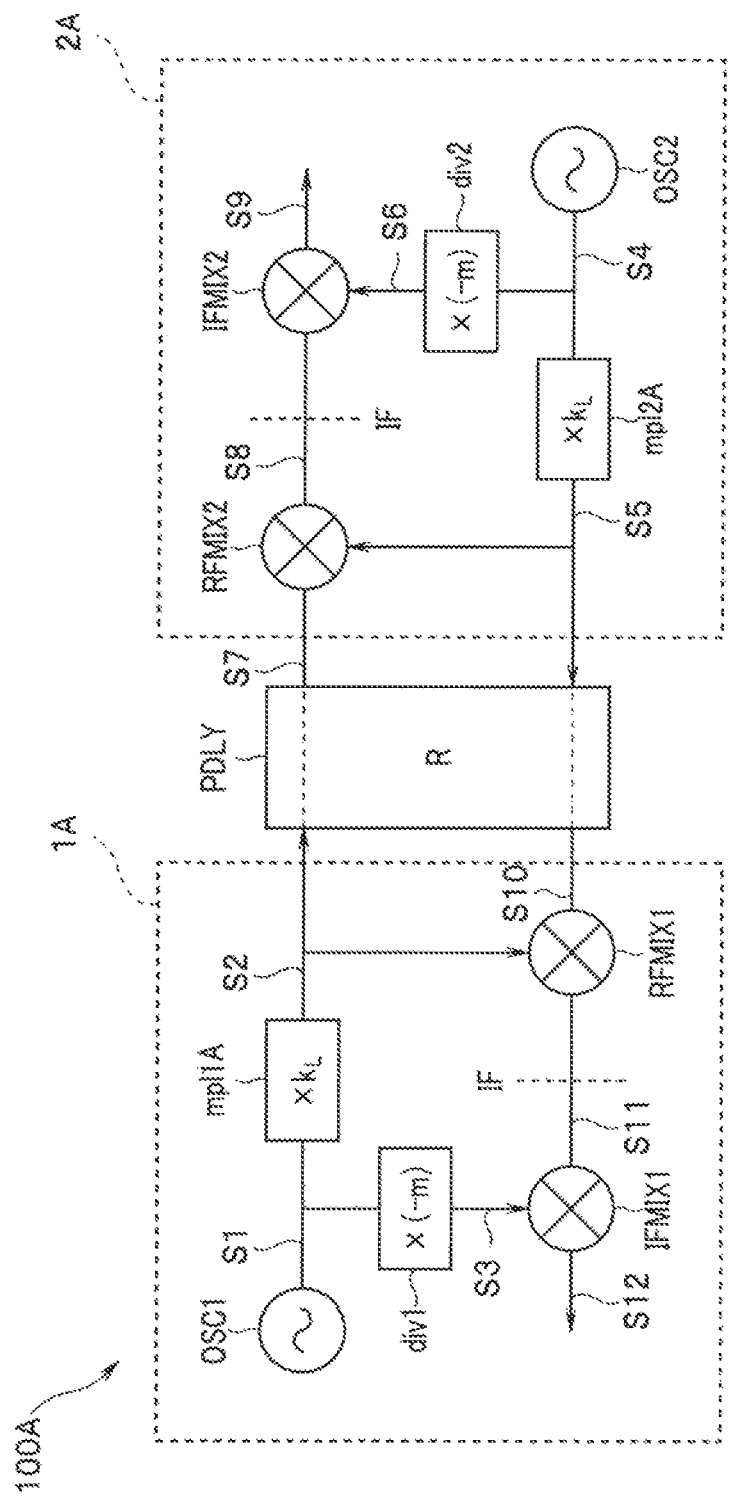
FIG. 2 is a configurational diagram of a wireless circuit of a distance measuring system in a related art that carries out distance measurement between two devices by a communication type phase detection method.

FIG. 2 is a configurational diagram of a wireless circuit of a distance measuring system in a related art that performs distance measurement between two devices by a communication type phase detection method. In FIG. 1 and FIG. 2, same components are assigned with same reference signs, and redundant explanation will be omitted for the same components.

First, with reference to FIG. 2, a reason why accurate measurement cannot be performed even when phase information of signals detected by reception units of two distance measuring devices that form a pair is used with distance measuring devices each of a configuration using a voltage-controlled oscillator (VCO) direct modulation method for a transmission unit, and using a super heterodyne (SH) method for a reception unit will be described. Further, FIG. 3 to FIG. 6 are diagrams for explaining operations in the devices in FIG. 2.

A distance measuring system 100A includes a device 1A and a device 2A. At least one of the device 1A and the device 2A is movable. In the distance measuring system 100A, a distance between the device 1A and the device 2A is calculated based on carrier phase detection. A case where one of the device 1A and the device 2A calculates the distance based on phase information acquired by the device 1A and the device 2A will be considered.

The device 1A transmits a first distance measurement signal (single wave signal), and the device 2A transmits a second distance measurement signal (single wave signal). The first and the second distance measurement signals reach the device 2A and the device 1A respectively via a propagation path PDLY between the device 1A and the device 2A. The device 1A and the device 2A each include a wireless circuit using a VCO direct modulation method of low power consumption for a transmission unit, and using an SH method of low power consumption for a reception unit.

FIG. 2 illustrates a configuration of simplified wireless units of the device 1A and the device 2A. The device 1A includes an oscillator (OSC1) peculiar to the device, a frequency multiplier (mpl1A), an RF frequency converter (RFMIX1), a frequency divider (div1), and an intermediate (IF) frequency converter (IFMIX1). The device 2A also includes a wireless architecture similar to the device 1A, and includes an oscillator (OSC2) peculiar to the device, a frequency multiplier (mpl2A), an RF frequency converter (RFMIX2), a frequency divider (div2), and an intermediate (IF) frequency converter (IFMIX2). Note that in the devices 1A and 2A, outputs of mpl1A and mpl2A are also used as local signals (LO signals). In other words, mpl1A and mpl2A respectively configure local oscillators.

Hereinafter, in order to clarify a problem, the device 1A and the device 2A are assumed to set transmission frequencies first of all. In other words, in an initial setting, for example, the transmission frequencies of the devices 1A and 2A are respectively set at frequencies obtained by multiplying the oscillation frequencies of OSC1 and OSC2 by a predetermined multiple $k_L$.

An output signal (oscillation signal) S1 ($=1o_{x1}$) of OSC1 of the device 1A can be expressed by equation (1) as follows with an initial phase of the oscillation signal of OSC1 set as $\theta_{x1}$.

$$1o_{x1} = \sin(2\pi f_{x1}t + \theta_{x1}) \quad (1)$$

The oscillation frequency of OSC1 is multiplied by $k_1$ by mpl1A. A phase $\phi_{tx1}$ of an output signal S2 of mpl1A is expressed as $$\phi_{tx1} = 2\pi k_L f_{x1} t + \theta_{Lx1} \quad (2).$$

Here, $\theta_{Lx1}$ is an initial phase of the output signal S2 of mpl1A. An output of mpl1A is generally generated by a phase locked loop (PLL) technique and a voltage-controlled oscillator (VCO) technique. Note that in mpl1A using a fractional PLL for a phase synchronizing unit of PLL, $\theta_{Lx1} = k_L \theta_{x1}$ is not generally established. Therefore, in equation (2) described above, the initial phase of the output S2 of mpl1A is defined as $\theta_{Lx1}$.

For the device 2A, a similar transmission frequency setting is also performed. An output signal S4 ($=1o_{x2}$) of OSC2 of the device 2A can be expressed by equation (3) as follows with an initial phase of the oscillation signal of OSC2 set as $\theta_{x2}$.

$$1o_{x2} = \sin(2\pi f_{x2} t + \theta_{x2}) \quad (3)$$

In mpl2A also, the oscillation frequency of OSC2 is multiplied by $k_L$. A phase $\phi_{tx2}$ of an output signal S5 of mpl2A is expressed as $$\phi_{tx2} = 2\pi k_L f_{x2} + \theta_{Lx2} \quad (4).$$

Here, $\theta_{Lx2}$ is an initial phase of the output of mpl2A. For the output of mpl2A, $\theta_{Lx2} = k_L \theta_{x2}$ is not generally established either as in the output of mpl1A. Therefore, in equation (4) described above, the initial phase of the output of mpl2A is defined as $\theta_{Lx2}$.

Patent Literature 1 discloses that in the case of a system of TDD (time division duplex) that does not simultaneously carry out transmission and reception, correct distance measurement can be performed by performing exchange of single wave signals between the device 1A and the device 2A. Note that the devices in Patent Literature 1 differ from the devices in FIG. 2 in configuration of the wireless units. Patent Literature 1 shows that distance measurement can be correctly performed by adopting a distance measurement sequence of "8 alternations" that repeats transmission and reception of four times each in total between the devices 1A and 2A by each using two single-wave signals. Transmitting and receiving while changing the frequency like this is enabled by changing settings of mpl1A and mpl2A in the devices 1A and 2A.

Figure 3:
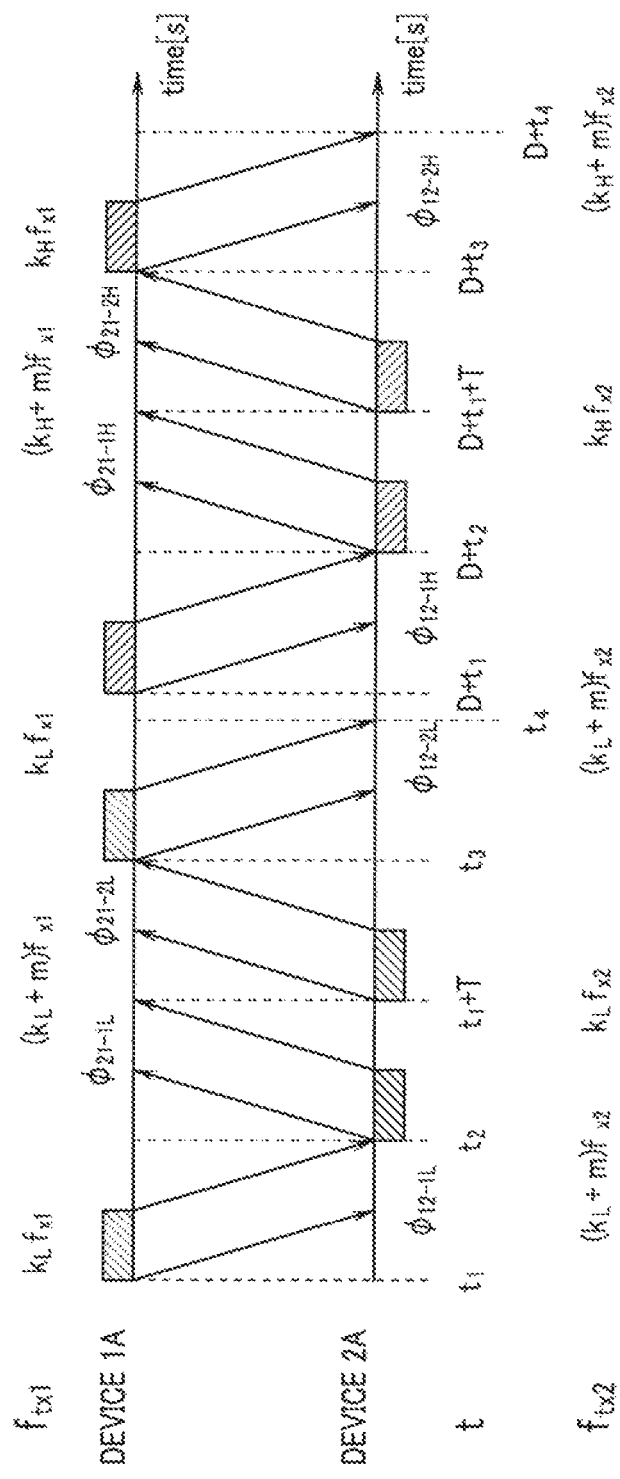
FIG. 3 is an explanatory diagram illustrating an "8 alternations" distance measuring sequence in a case where the distance measuring devices each using a VCO direct modulation method for a transmission unit, and a heterodyne method for a reception unit.

FIG. 3 illustrates an example of an "8 alternations" distance measurement sequence in a case where the distance measuring devices each using a VCO direct modulation method for the transmission unit, and a heterodyne method for the reception unit are employed. Explaining an order of alternations by paying attention to transmission signals regarding the distance measurement sequence in FIG. 3, the order is as follows. The device 1A transmits signals of a frequency $K_L f_{x1}$ at times $t=t_1$, and $t=t_3$, and transmits signals of frequency $k_H f_{x1}$ at times $D+t_1$, and $D+t_3$. The device 2A transmits a signal of a frequency $k_L f_{x2}$ twice from a time $t_2$, and transmits a signal of frequency $k_H f_{x2}$ twice from a time $D+t_2$.

The device 1A and the device 2A perform transmission after the frequencies of the transmission signals are respectively set at $k_L f_{x1}$ and the frequency of $k_L f_{x2}$ (hereinafter, these frequencies are also referred to as low frequencies) in the initial setting. When only transmission of the devices 1A and 2A is considered, a single wave signal of the frequency $k_L f_{x1}$ is transmitted from the device 1A to the device 2A first, and the device 2A receives the single wave signal of the frequency $k_L f_{x1}$ from the device 1A. FIG. 3 shows that transmission is performed at the time $t_1$ after it takes a predetermined time period for the device 1A to be set to transmit the single wave signal of the frequency $k_L f_{x1}$ to the device 2A.

Next, after it takes a predetermined time period for the device 2A to be set to transmit the single wave signal of the frequency $k_L f_{x2}$ to the device 1A, transmission of the single wave signal is performed twice at the time $t_2$. Furthermore, a single wave signal of the frequency $k_L f_{x1}$ is transmitted from the device 1A to the device 2A again, and the device 2A receives the single wave signal of the frequency $k_L f_{x1}$ from the device 1A. The device 1 takes a predetermined time period for the transmission, and performs transmission at the time $t_3$. The signal exchanges end at a time $t_4$.

Figure 4:
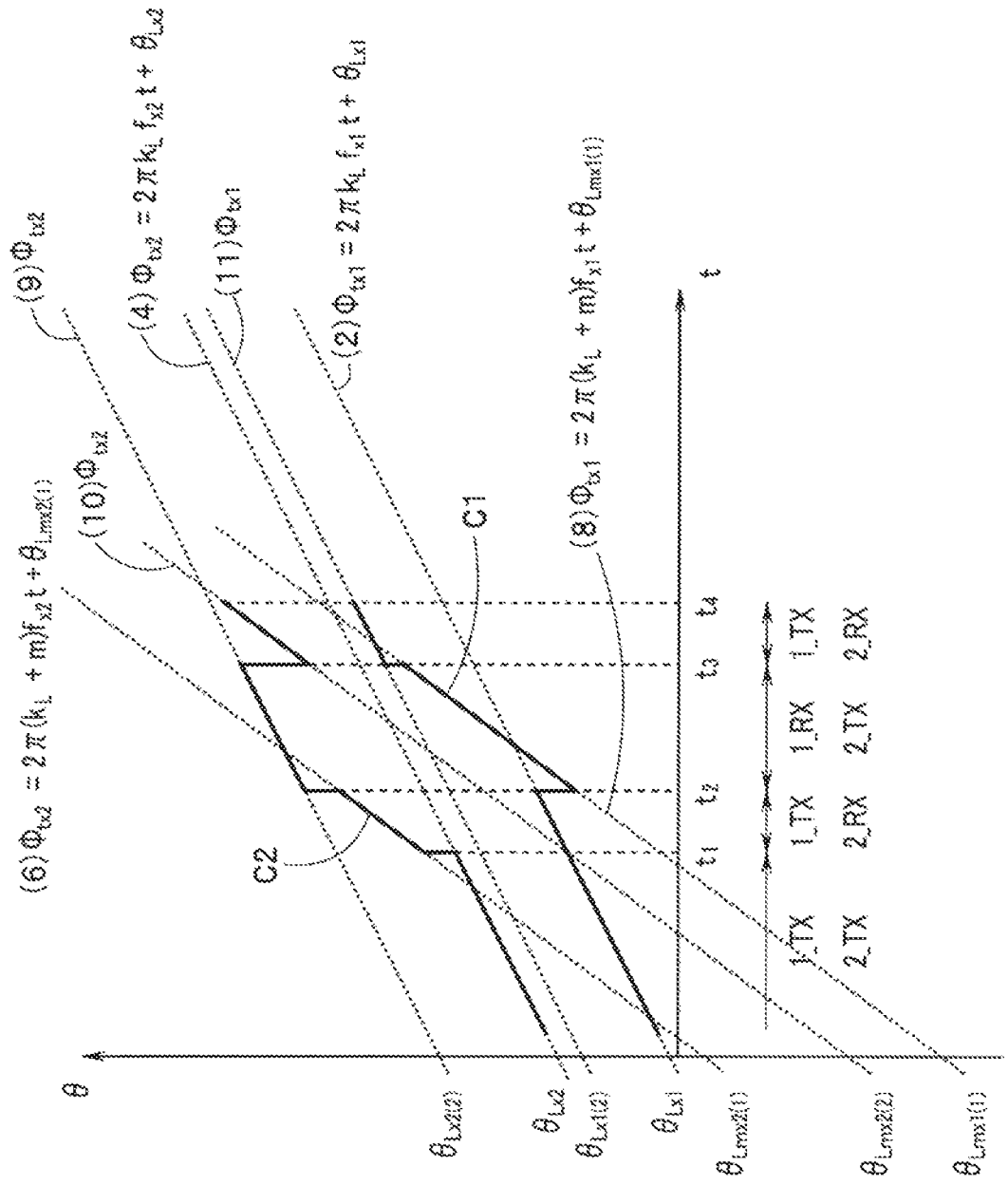
FIG. 4 is a graph illustrating changes of phases of signals S2 and S5 in the "8 alternations" distance measuring sequence, by plotting a time in a horizontal axis, and plotting a phase $\theta$ in a vertical axis.

FIG. 4 is a graph illustrating changes in phases of the signals S2 and S5 in the "8 alternations" distance measurement sequence, with a time plotted in a horizontal axis and a phase $\theta$ plotted in a vertical axis. Note that numbers shown in parentheses in FIG. 4 correspond to numbers of equations in the description. In the initial phases shown in the vertical axis in FIG. 4, L included in subscripts indicates that the single wave signal has a low frequency, x1 indicates the initial phase of the signal S2, x2 indicates the initial phase of the signal S5, m indicates a case of multiplying the frequency by ($k_L$+m), and numbers in subscript parentheses of the phases $\theta$ in FIG. 4 correspond to orders of a change in frequency from the frequency of the initial setting without parentheses. In the description, the same subscripts will be used hereinafter, and H of a subscript in each of signs indicating the initial phases of the signals S2 and S5 indicates that the single wave signal has a high frequency.

A dashed straight line (2) in FIG. 4 represents a phase $\phi_{tx1}$ of the output signal S2 of mpl1A of the device 1A, and a dashed straight line (4) represents a phase $\phi_{tx2}$ of the output signal S5 of a mpl2A of the device 2A. The phase $\phi_{tx1}$ has a linear characteristic having an inclination of $2\pi K_L f_{x1}$ with the initial phase as $\theta_{Lx1}$. The phase $\phi_{tx2}$ a has a linear characteristic having an inclination of $2\pi K_L f_{x2}$ with the initial phase as $\theta_{Lx2}$.

However, in the distance measuring device in FIG. 2 using a VCO direct modulation method and a heterodyne method, it is necessary to change the frequencies of the transmission signals of mpl1A and mpl2A at a transmission time and a reception time.

Figure 5:
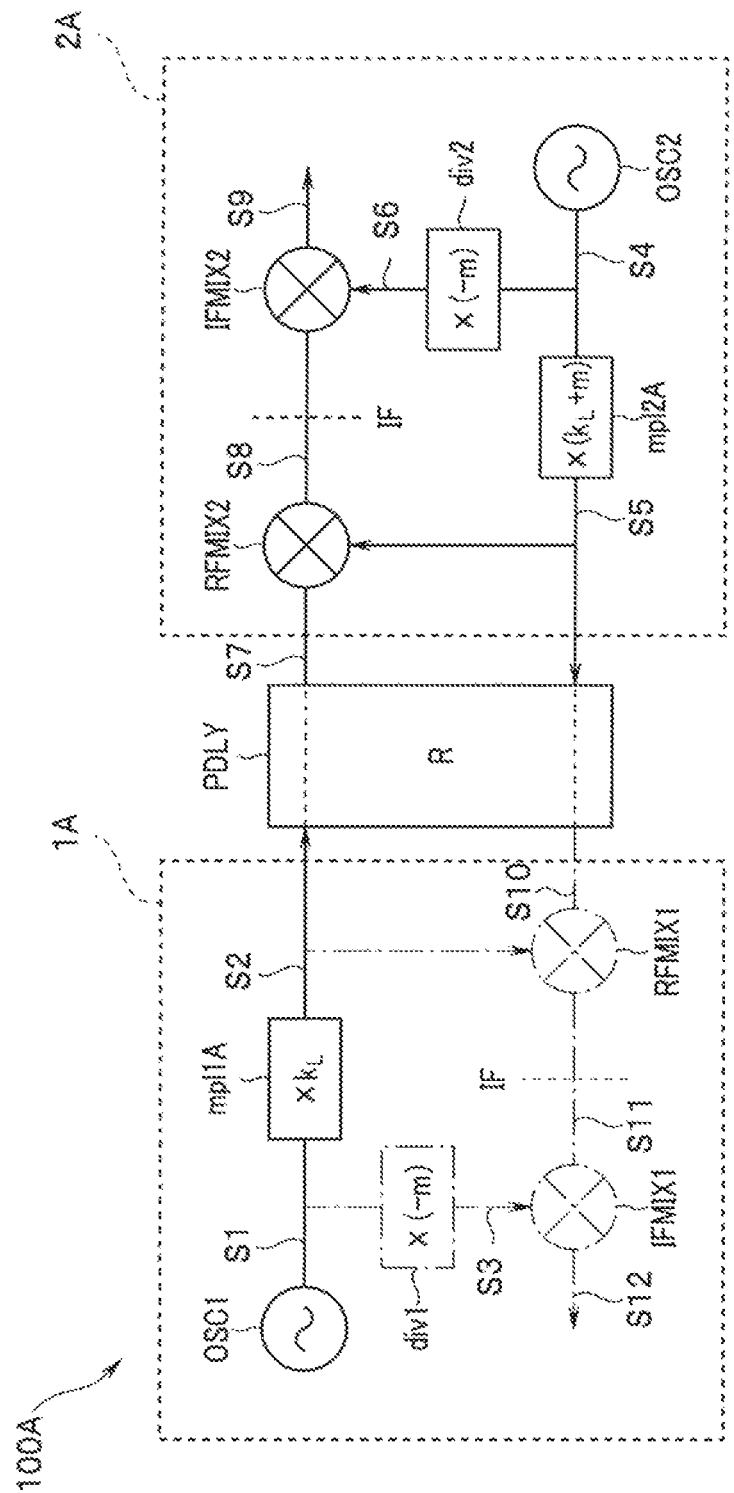
FIG. 5 is an explanatory diagram illustrating settings of a device 1A and a device 2A between a time $t_1$ and a time $t_2$ of FIG. 3.

FIG. 5 is an explanatory diagram illustrating settings of the device 1A and the device 2A between the time $t_1$ and the time $t_2$ in FIG. 3. Note that in a period between the times $t_1$ and $t_2$, a reception operation of the device 1A is not performed, and therefore unnecessary units for operation are shown by dash-dotted lines.

In the heterodyne method, a reception signal is converted into an IF frequency. In an example of FIG. 5, RFMIX2 of the device 2A needs to convert a reception signal into an IF frequency of approximately $-m f_{x2}$. For this reason, in the device 2A that receives a single wave signal of the frequency $k_L f_{x1}$ from the device 1A, a frequency of the local signal (LO signal) S5 from mpl2A which is given to RFMIX2 is set at ($k_L$+m) $f_{x2}$ instead of $k_L f_{x2}$. The reception signal that is converted into the IF frequency has frequency converted by the IF frequency converter (IFMIX2), and an output signal S9 of a base band is obtained. An output signal S4 of OSC2 is frequency-divided to a signal S6 having a frequency obtained by multiplying the output signal S4 by $-m$ by div2, and the signal S6 is used as an LO signal for IFMIX2. A phase $\phi_{b2}$ of the signal S6 is expressed by equation (5) as follows.

$$\phi_{b2} = -m 2\pi f_{x2} t + \theta_{Bx2} \quad (5)$$

Here, $\theta_{Bx2}$ is an initial phase of the LO signal for IFMIX2 from div 2, and the frequency $-m f_{x2}$ is an IF frequency.

In order to receive a signal from the device 1A in the device 2A, the phase $\phi_{tx2}$ of the output signal S5 of mpl2A is set at what is shown by equation (6) as follows that is obtained by transforming equation (4) described above.

$$\phi_{tx2}=2\pi(k_L+m)f_{x2}t+\theta_{Lmx2(1)} \quad (6)$$

Here, $\theta_{Lmx2(1)}$ is an initial phase of the output signal S5 of mpl2A between the time $t_1$ and the time $t_2$. Note that it is not necessary to change the frequency of mpl1A in the device 1A, and therefore the phase 4 of the output signal S2 of mpl1A remains as in equation (2).

Figure 6:
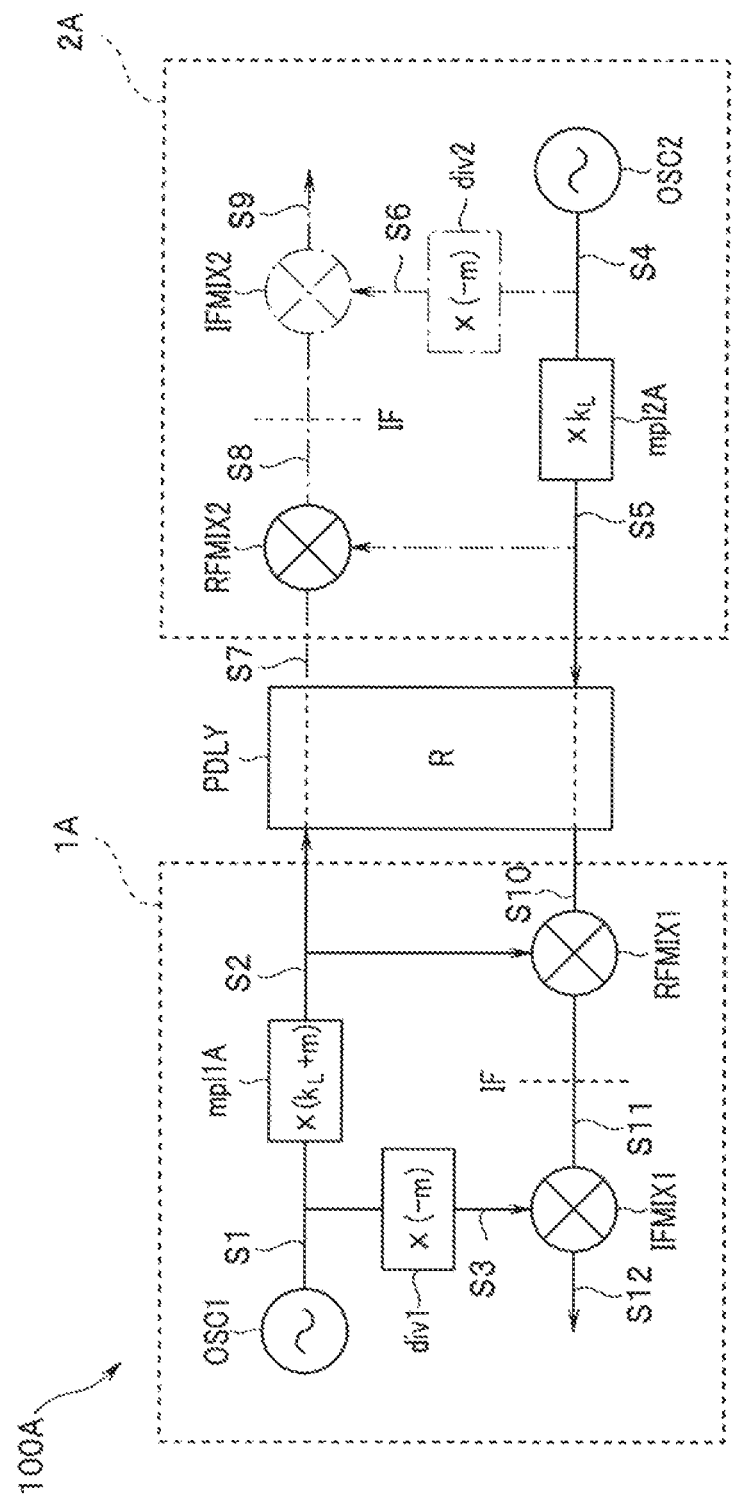
FIG. 6 is a diagram for explaining operations in the devices of FIG. 2.

FIG. 6 is an explanatory diagram illustrating settings of the device 1A and the device 2A between the time $t_2$ and the time $t_3$ in FIG. 3. Note that in a period between the time $t_2$ and the time $t_3$, a reception operation of the device 2A is not performed, and therefore unnecessary units for operation are shown by dash-dotted lines.

In also the device 1A that adopts a heterodyne method, RFMIX1 needs to convert a reception signal into an IF frequency of approximately $-mf_{x1}$. For this reason, in the device 1A that receives a single wave signal of the frequency $k_L f_{x2}$ from the device 2A, the frequency of the local signal (LO signal) S2 from mpl1A which is given to RFMIX1 is set at $k_L+m)f_{x1}$ instead of $k_L f_{x1}$. The reception signal that is converted into the IF frequency has frequency converted by the IF frequency converter (IFMIX1), and an output signal S12 is obtained. An output signal S1 of OSC1 is frequency-divided to a signal S3 having a frequency obtained by multiplying an output signal S1 of OSC1 by $-m$ by div1, and the signal S3 is used as an LO signal for IFMIX1. A phase $\phi_{b1}$ of the signal S3 is expressed by equation (7) as follows.

$$\phi_{b1}=-m2\pi f_{x1}t+\theta_{Bx1} \quad (7)$$

Here, $\theta_{Bx1}$ is an initial phase of the LO signal for IFMIX1 from div1, and the frequency $-mf_{x1}$ is an IF frequency.

In order to receive a signal from the device 2A, in the device 1A, the phase $\phi_{tx1}$ of the output signal S2 of mpl1A is set at what is shown by equation (8) as follows that is obtained by transforming equation (2) described above.

$$\phi_{tx1}=2\pi(k_L+m)f_{x1}t+\theta_{Lmx1(1)} \quad (8)$$

Here, $\theta_{Lmx1(1)}$ is an initial phase of the output signal S2 of mpl1A between the time $t_2$ and the time $t_3$.

The device 2A returns the setting of the transmission frequency from $(k_L+m) f_{x2}$ to $k_L f_{x2}$ in a period between the time $t_2$ and the time $t_3$. At this time, the phase $\phi_{tx2}$ of the output signal S5 of mpl2A is expressed by equation (9) as follows. Note that $\theta_{Lx2(2)}$ is an initial phase of the signal S5 in this case.

$$\phi_{tx2}=2\pi k_L f_{x2}t+\theta_{Lx2(2)} \quad (9)$$

Settings of the device 1A and the device 2A are same as the settings in FIG. 5, between the time $t_3$ and the time $t_4$ that are in a next sequence. In the device 2A, in order to receive a single wave signal of the frequency $k_L f_{x1}$ from the device 1A, the frequency of the LO signal (signal S5) given to RFMIX2 is changed from $k_L f_{x2}$ to $(k_L+m)f_{x2}$. Note that in this case, the phase $\phi_{b2}$ of the LO signal (signal S6) for IFMIX2 given to IFMIX2 is the same as in equation (5) described above.

The phase $\phi_{tx2}$ of the output signal S5 of mpl2A of the device 2A is given by equation (10) as follows obtained by transforming equation (9) described above.

$$\phi_{tx2}=2\pi(k_L+m)f_{x2}t+\theta_{Lmx2(2)} \quad (10)$$

Here, $\theta_{Lmx2(2)}$ is the initial phase of the output signal S5 of mpl2A between the time $t_3$ and the time $t_4$.

The device 1A returns the transmission frequency from $(k_L+m) f_{x1}$ to $k_L f_{x1}$. At this time, the phase $\phi_{tx1}$ of the output signal S2 of mpl1A is set at what is shown by equation (11) as follows.

$$\phi_{tx1}=2\pi k_L f_{x1}t+\theta_{Lx1(2)} \quad (11)$$

Here, $\theta_{Lx1(2)}$ is the initial phase of the output signal S2 of mpl1A between the time $t_3$ and the time $t_4$.

In this way, between the time $t_1$ and the time $t_4$, the phase $\phi_{tx1}$ of the signal S2 of mpl1A changes as shown by a thick line characteristic C1 in FIG. 4, and the phase $\phi_{tx2}$ of the signal S5 of mpl2A changes as shown by a thick line characteristic C2 in FIG. 4.

From a time $D+t_1$ to a time $D+t_8$ in FIG. 3, a single wave signal of the frequency of $k_H f_{x1}$ is transmitted from the device 1A, and a single wave signal of the frequency of $k_H f_{x2}$ is outputted from the device 2A. Hereinafter, these frequencies are also referred to as high frequencies. A sequence in this case only differs from the above sequence in that $k_L$ is changed to kit in FIG. 5 and FIG. 6, and therefore explanation will be omitted.

Next, referring to FIG. 5, a phase $\phi_{BB2L(T12)}(t)$ of the base band signal S9 detected in the device 2A between the time $t_1$ and the time $t_2$ is obtained while phases of mpl1A and mpl2A are considered. A phase $\phi_{rx2}$ of a signal S7 after passing through the propagation path PDLY is expressed by equation (12) as follows.

$$\phi_{rx2}=2\pi k_L f_{x1}(t-\tau_R)+\theta_{Lx1} \quad (12)$$

Here, $\tau_R$ is a delay time of a propagation path length R. The signal S7 is frequency-converted by using the signal S5 (LO signal). From equation (12) and equation (6), a phase $\phi_{ifx2(T12)}(t)$ of an output signal S8 of RFMIX2 is expressed by equation (13) as follows.

$$\phi_{ifx2(T12)}(t)=2\pi k_L(f_{x1}-f_{x2})t-2\pi mf_{x2}t+(\theta_{Lx1}-\theta_{Lmx2(1)})-2\pi k_L f_{x1}\tau_R \quad (13)$$

Note that equation (13) shows a phase result of extracting only a desired signal. The signal is frequency-converted by using the signal S6. Accordingly, from equation (13) and equation (5), the phase $\phi_{BB2L(T12)}(t)$ of the signal S9 detected in the device 2A is what is expressed by equation (14) as follows.

$$\phi_{BB2L(T12)}(t)=2\pi k_L(f_{x1}-f_{x2})t+(\theta_{Lx1}-\theta_{Lmx2(1)})-\theta_{Bx2}-2\pi k_L f_{x1}\tau_R \quad (14)$$

Note that equation (14) shows a result of performing desired quadrature demodulation.

Similarly, with reference to FIG. 5, a phase of the signal S9 detected in the device 2A between the time $t_3$ and the time $t_4$ is obtained. From equation (11), the phase of the signal S7 after passing through the propagation path PDLY is expressed by $$\phi_{rx2}=2\pi k_L f_{x1}(t-\tau_R)+\theta_{Lx1(2)} \quad (15)$$

from equation (11). The signal S7 is frequency-converted by the signal S5 (LO signal). From equation (15) and equation (10), a phase $\phi_{ifx2(T34)}(t)$ of an output signal S8 of RMIX2 is expressed by equation (16) as follows.

$$\phi_{ifx2(T32)}(t)=2\pi k_L(f_{x1}-f_{x2})t-2\pi mf_{x2}t+(\theta_{Lmx2(2)}-\theta_{Lmx2(2)})-2\pi k_L f_{x1}\tau_R \quad (16)$$

Note that equation (16) shows a phase result of extracting only a desired signal. The signal is frequency-converted by using the signal S6. From equation (16) and equation (5), a phase $\phi_{BB2L(T34)}(t)$ of the signal S9 detected in the device 2A is $$\phi_{BB2L(T34)}(t)=2\pi k_L(f_{x1}-f_{x2})t+(\theta_{Lx1(2)}-\theta_{Lmx2(2)})-\theta_{Bx2}-2\pi k_L f_{x1}\tau_R \quad (17).$$

Note that equation (17) describes a result of performing desired quadrature demodulation.

Next, with reference to FIG. 6, a phase of the signal S12 detected in the device 1A between the time $t_2$ and the time $t_3$ is obtained. A phase $\phi_{rx1}$ of a signal S10 after passing through the propagation path POLY is given by equation (18) as follows from equation (9) described above.

$$\phi_{rx1}=2\pi k_L f_{x2}(t-\tau_R)+\theta_{Lx2(2)} \quad (18)$$

The signal S10 is frequency-converted by using the signal S2 (LO signal) in RFMIX1. From equation (18) and equation (8), a phase $\phi_{ifx1(T23)}(t)$ of an output signal S11 of RFMIX1 is expressed by equation (19) as follows.

$$\phi_{ifx1(T23)}(t)=2\pi k_L(f_{x2}-f_{x1})t-2\pi m f_{x1}t+(\theta_{Lx2(2)}-\theta_{Lmx1(1)})-2\pi k_L f_{x2}\tau_R \quad (19)$$

Note that expression (19) shows a phase result of extracting only a desired signal. The signal S11 is frequency-converted by using the signal S3. As a result, a phase $\phi_{BB2L(T23)}(t)$ of the signal S9 detected in the device 2A is expressed by equation (20) as follows from equation (19) and equation (7).

$$\phi_{BB2L(T23)}(t)=2\pi k_L(f_{x2}-f_{x1})t+(\theta_{Lx2(2)}-\theta_{Lmx1(1)})-\theta_{Bx1}-2\pi k_L f_{x2}\tau_R \quad (20)$$

Note that equation (20) describes a result that a desired quadrature modulation is performed.

Patent Literature 1 shows that a distance can be obtained by addition of the phases of the reception signals obtained by the distance measurement sequence. In the example of FIG. 3, an addition result $\phi_{BBLSUM}(t)$ of four phases is expressed by equation (21) as follows when the four phases of reception signals obtained in transmission and reception of single wave signals of a low frequency from the time $t_1$ to the time $t_4$ are respectively $\phi_{12-1L}$, $\phi_{21-1L}$, $\phi_{21-2L}$, and $\phi_{12-2L}$.

$$\phi_{BBLSUM}(t)=\phi_{12-1L}+\phi_{21-1L}+\phi_{21-2L}+\phi_{12-2L} \quad (21)$$

When an interval between the time $t_2$ and the time $t_1$ and an interval to between the time $t_4$ and the time $t_3$ are defined as $$t_0=t_2-t_1=t_4-t_3 \quad (22),$$

and a time interval from a time at which a first distance measurement signal is transmitted from the device 1A to a time at which a second distance measurement signal is transmitted from the device 2A is set as T, the four-phase addition result of equation (21) is as shown in equation (23) as follows.

$$\phi_{BBLSUM}(t)=\phi_{BB2L(T12)}(t+t_0)+\phi_{BB2L(T23)}(t+T)+\phi_{BB2L(T34)}(t+t_0+T) \quad (23)$$

Equation (14), equation (17) and equation (20) described above are substituted into equation (23) described above, and thereby equations (24) and (25) as follows are obtained.

$$\phi_{BBLSUM}(t)=-4\pi k_L(f_{x1}+f_{x2})\tau_R-2(\theta_{Bx1}+\theta_{Bx2})+\theta_{LSUM} \quad (24)$$

$$\theta_{LSUM}=(\theta_{Lx1}-\theta_{Lmx2(1)})+2\times(\theta_{Lx2(2)}-\theta_{Lmx1(1)})+(\theta_{Lx1(2)}-\theta_{Lmx2(2)}) \quad (25)$$

When a delay $\tau_R$ is obtained from equation (24) described above, the delay $\tau_R$ corresponding to a distance between devices is what is shown by equation (26) as follows.

$$\tau_R=(\theta_{Bx1}+\theta_{Bx2})/\{2\pi k_L(f_{x1}+f_{x2})\}-\theta_{LSUM}/\{4\pi k_L(f_{x1}+f_{x2})\}+\phi_{BBLSUM}(t)/\{4\pi k_L(f_{x1}+f_{x2})\} \quad (26)$$

A third term of equation (26) described above is the addition result of the four phases, and is obtained by measurement. However, the other terms are difficult to detect. Accordingly, correct distance measurement cannot be performed with four alternations of single wave signals of a low frequency.

In the distance measurement sequence in FIG. 3, the devices 1A and 2A carry out a sequence using single wave signals of a high frequency following the low frequency transmission. The high-frequency sequence is similar to the low-frequency sequence, but a difference lies in changing the frequency setting parameter $k_L$ to $k_H$. Important equations for analysis will be shown as follows.

Between a time $D+t_1$ and a time $D+t_2$, the device 2A receives a single wave signal of a frequency $k_H f_{x1}$ from the device 1A. A phase $\phi_{BB2H(T12)}(t)$ of a signal S7 received by the device 2A is expressed by equation (27) as follows.

$$\phi_{BB2H(T12)}(t)=2\pi k_H(f_{x1}-f_{x2})t+(\theta_{Hx1}-\theta_{Hmx2(1)})-\theta_{Bx2}-2\pi k_H f_{x1}\tau_R \quad (27)$$

Note that $\theta_{Hx1}$ is an initial phase of the signal S2 of the frequency $k_H f_{x1}$ of the device 1A, and $\theta_{Hmx2(1)}$ is an initial phase of the signal S5 of a frequency $(k_H+m)f_{x2}$ of the device 2A.

Between a time $D+t_2$ and a time $D+t_3$, the device 1A receives a single wave signal of a frequency $k_H f_{x2}$ from the device 2A. A phase $\phi_{BB2H(T23)}(t)$ of the signal S10 received by the device 1A is expressed by equation (28) as follows.

$$\phi_{BB2H(T23)}(t)=2\pi k_H(f_{x2}-f_{x1})t+(\theta_{Hx2(2)}-\theta_{Hmx1(1)})-\theta_{Bx1}-2\pi k_H f_{x2}\tau_R \quad (28)$$

Note that $\theta_{Hx2(2)}$ is an initial phase of the signal S5 of the frequency $k_H f_{x2}$ of the device 2A, and $\theta_{Hmx1(1)}$ is an initial phase of the signal S2 of the frequency $(k_H+m)f_{x1}$ of the device 1A.

Between a time $D+t_3$ and a time $D+t_4$, the device 2A receives a single wave signal of a frequency $k_H f_{x1}$ from the device 1A. A phase $\phi_{BB2H(T34)}(t)$ of the signal S7 received by the device 2A is expressed by equation (29) as follows.

$$\phi_{BB2H(T34)}(t)=2\pi k_H(f_{x1}-f_{x2})t+(\theta_{Hx1(2)}-\theta_{Hmx2(2)})-\theta_{Bx2}-2\pi k_H f_{x1}\tau_R \quad (29)$$

Note that an initial phase $\theta_{Hx1(2)}$ is an initial phase of the signal S2 of the frequency $k_H f_{x1}$ of the device 1A, and $\theta_{Hmx2(2)}$ is the initial phase of the signal S5 of the frequency $(k_H+m)f_{x2}$ of the device 2A.

In the example of FIG. 3, an addition result $\phi_{BBHSUM}(t)$ of four phases is expressed by equation (30) as follows when the four phases of reception signals obtained in transmission and reception of single wave signals of a high frequency from the time $D+t_1$ to the time $D+t_4$ are respectively $\phi_{12-1H}$, $\phi_{21-1H}$, $\phi_{21-2H}$, and $\phi_{12-2H}$.

$$\phi_{BBHSUM}(t)=\phi_{12-1H}+\phi_{21-1H}+\phi_{21-2H}+\phi_{12-2H} \quad (30)$$

When equation (22) and the information on the time T are added to equation (30) described above, equation (31) as follows is obtained.

$$\phi_{BBHSUM}(t)=\phi_{BB2H(T12)}(t)+\phi_{BB2H(T23)}(t+t_0)+\phi_{BB2H(T23)}(t+T)+\phi_{BB2H(T34)}(t+T+t_0) \quad (31)$$

When equation (31) is transformed by using equation (27), equation (28), and equation (29), equation (32) and equation (33) as follows are obtained.

$$\phi_{BBHSUM}(t)=-4\pi k_H(f_{x1}+f_{x2})\tau_R-2(\theta_{Bx1}+\theta_{Bx2})+\theta_{HSUM} \quad (32)$$

$$\theta_{HSUM}=(\theta_{Hx1}-\theta_{Hmx2(1)})+2\times(\theta_{Hx2(2)}-\theta_{Hmx1(1)})+(\theta_{Hx1(2)}-\theta_{Hmx2(2)}) \quad (33)$$

When the delay $\tau_R$ corresponding to the distance between the devices is made a subject of equation (33), equation (34) as follows is obtained.

$$\tau_R = (\theta_{Bx1} + \theta_{Bx2})/\{2\pi k_H(f_{x1}+f_{x2})\} - \theta_{HSUM}/\{4\pi k_H(f_{x1}+f_{x2})\} + \phi_{BBHSUM}(t)/\{4\pi k_H(f_{x1}+f_{x2})\} \quad (34)$$

A third term of equation (34) is the addition result of the four phases, and can be detected by measurement. However, the other terms are difficult to detect. Accordingly, correct distance measurement cannot be performed with transmission and reception of four alternations by single wave signals of a high frequency.

Next, distance measurement using two waves of a low frequency and a high frequency is considered. In other words, the delay $\tau_R$ is obtained by performing subtraction of equation (23) and equation (31) described above. Equation (35) as follows is obtained by subtraction of equation (23) and equation (31).

$$\phi_{BBLSUM}(t) - \phi_{BBHSUM}(t) = 4\pi(k_H - k_L)(f_{x1}+f_{x2})\tau_R + \theta_{LSUM} - \theta_{HSUM} \quad (35)$$

From equation (35), the delay $\tau_R$ is obtained by equation (36) as follows.

$$\tau_R = -(\theta_{LSUM} - \theta_{HSUM})/4\pi(k_H - k_L)(f_{x1}+f_{x2}) + (\phi_{BBLSUM}(t) - \phi_{BBHSUM}(t))/4\pi(k_H - k_L)(f_{x1}+f_{x2}) \quad (36)$$

A second term of equation (36) is a value that is obtained by an operation of the phases of the received single wave signals, that is, a measurement value. However, a first term in equation (36) shows addition and subtraction of the initial phases of the signals S2 and S5 of the devices 1A and 2A that are expressed by equation (25) and equation (33). The initial phases of the signals S2 and S6 are as shown in FIG. 4 in the distance measurement sequence in FIG. 3. In the proposal of Patent Literature 1, accurate distance measurement is possible by cancelling components of the initial phase by using the condition that the initial phase does not change in the distance measurement sequence. However, when a VCO direct modulation method and a heterodyne method are used, the initial phase changes each time the frequency setting is changed as in FIG. 4, so that the first term of equation (36) described above cannot be obtained, and the propagation delay time $\tau_R$ cannot be accurately calculated. Since a distance can be calculated by multiplying the propagation delay time period by a light velocity, the distance cannot be accurately calculated in other words.

Note that the above described explanation shows the problem that the distance measurement cannot be accurately performed due to the fluctuations of the initial phases of the output signals of mpl1A and mpl2A that are local oscillators in the distance measuring devices. However, it is conceivable that not only the distance measuring device but also various devices that detect the phases of signals by using local oscillators may not be able to achieve desired functions due to fluctuation in the initial phases of the output signals. The present embodiment is applicable to the various devices that detect the phases of signals by using the local oscillators like this.

(Correction Method of Initial Phase that Fluctuates)

In the present embodiment, it is made possible to achieve a same function as in a case where an initial phase is not changed, in a device using local oscillators, by adopting a reference phase device for obtaining a phase (hereinafter, referred to as a reference phase) that changes according to a frequency at an initial setting time from an initial phase at a time of occurrence of a frequency of initial setting, that is, an initial phase before performing resetting of the frequency, obtaining a fluctuation amount of the phase by an initial phase change and a frequency change by obtaining a difference between the reference phase and the phase after resetting of the frequency, and correcting the phase according to the obtained fluctuation amount.

(Distance Measuring Device)

In FIG. 1, devices 1 and 2 that are distance measuring devices each has a configuration using a voltage-controlled oscillator (VCO) direct modulation method for a transmission unit, and using a super heterodyne (SH) method for a reception unit. A distance measuring system 100 of the present embodiment includes the device 1 and the device 2, and at least one of the device 1 and the device 2 is movable. The device 1 transmits a first distance measurement signal (single wave signal), and the device 2 transmits a second distance measurement signal (single wave signal). The first and the second distance measurement signals respectively reach the device 2 and the device 1 via the propagation path PDLY between the device 1 and the device 2.

In FIG. 1, the device 1 has an oscillator (OSC1) peculiar to the device, a frequency multiplier (mpl1), an RF frequency converter (RFMIX1), a frequency divider (div1), and an intermediate (IF) frequency converter (IFMIX1). The device 2 has a same configuration as the configuration of the device 1, and has an oscillator (OSC2) peculiar to the device, a frequency multiplier (mpl2), an RF frequency converter (RFMIX2), a frequency divider (div2), and an intermediate (IF) frequency converter (IFMIX2).

In other words, a main point where the devices 1 and 2 respectively differ from the devices 1A and 2A in FIG. 2 is that the devices 1 and 2 respectively adopt mpl1 and mpl2 in place of mpl1A and mpl2A. In mpl1 and mpl2, respective outputs are also used as local signals (LO signal). In other words, mpl1 and mpl2 respectively configure local oscillators.

An LO signal similar to the LO signal of mpl1A or mpl2A can be generated by each of mpl1 and mpl2. Accordingly, in the present embodiment, the distance measurement sequence illustrated in FIG. 3 can also be carried out, and equation (36) described above obtaining the delay $\tau_R$ corresponding to the distance between the devices is established. The present embodiment enables accurate distance measurement by obtaining the value of the first term of equation (36) described above by adopting mpl1 and mpl2.

Figure 7:
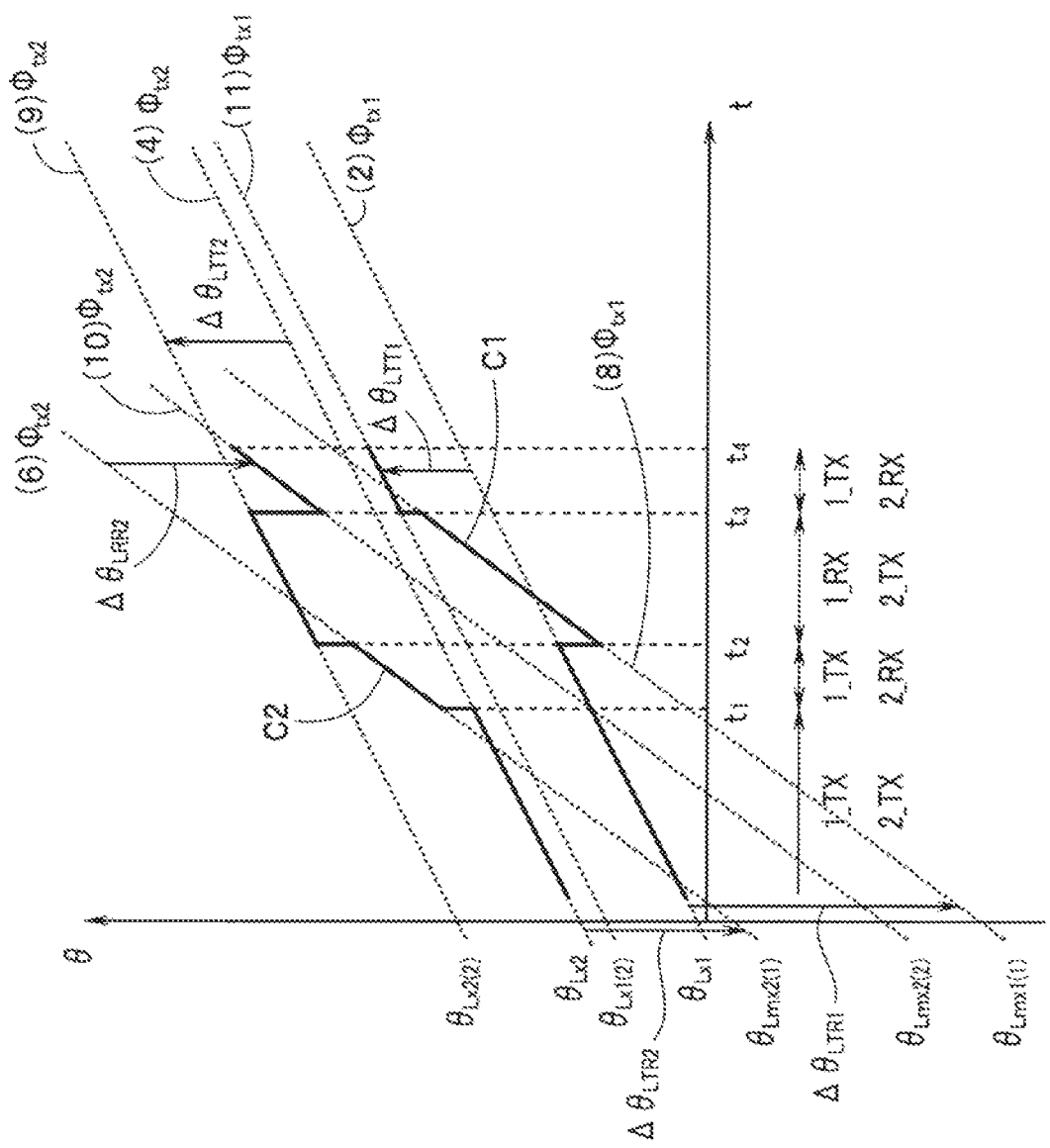
FIG. 7 is a graph in which arrows explaining information on three kinds of phase differences are added to a graph similar to the graph of FIG. 4.

First, with reference to a graph in FIG. 7, three kinds of phase differences that are necessary to calculate the first term of equation (36) described above will be described. FIG. 7 is a diagram in which arrows explaining information on the three kinds of phase differences are added to a graph similar to the graph in FIG. 4. Note that in FIG. 7 and FIG. 8 described later, TT included in subscripts in signs indicating the three kinds of phase differences indicates that a phase difference is related to a fluctuation in a phase of a signal, the frequency of which is multiplied by $k_L$, RR indicates that a phase difference is related to a fluctuation in a phase of a signal, the frequency of which is multiplied by $(k_L+m)$, and TR indicates that a phase difference is related to changes of the phase of the signal, the frequency of which is multiplied by $k_L$ and the phase of the signal, the frequency of which is multiplied by $(k_L+m)$. Further, L included in the subscripts in the signs indicating the phase differences indicates that the single wave signal has a low frequency, H indicates that a single wave signal has a high frequency, 1 indicates that a phase difference is related to the signal S2, and 2 indicates that a phase difference is related to the signal S5.

As described above, the devices 1 and 2 perform initial settings of transmission frequencies by the time $t_1$ in FIG. 3. In other words, the device 1 and the device 2 respectively have the transmission frequencies set at $k_L f_{x1}$, and $k_L f_{x2}$ by mpl1 and mpl2. Explaining the distance measurement sequence in the low frequency in FIG. 3 again, the initial phase of the output signal S2 of mpl1 of the device 1 changes to an initial phase $\theta_{Lx1}$ before the time $t_2$, an initial phase $\theta_{Lmx1(1)}$ from the time $t_2$ to the time $t_3$, and an initial phase $\theta_{Lx1(2)}$ from the time $t_3$ to the time $t_4$. As for the device 2, the initial phase of the output signal S5 of mpl2 changes to an initial phase $\theta_{Lx2}$ before the time $t_1$, an initial phase $\theta_{Lmx2(2)}$ from the time $t_1$ to the time $t_2$, an initial phase $\theta_{Lx2(2)}$ from the time $t_2$ to the time $t_3$, and an initial phase $\theta_{Lmx2(2)}$ from the time $t_3$ to the time $t_4$.

Phase differences $\Delta\theta_{LTT1}$ and $\Delta\theta_{LTR1}$ are phase differences concerning the device 1. The phase difference $\Delta\theta_{LTT1}$ is a difference between the initial phase $\theta_{Lx1(2)}$ from the time $t_3$ to the time $t_4$ and the initial phase $\theta_{Lx1}$ before the time $t_2$ in the signal S2. The phase difference $\Delta\theta_{LTR1}$ is a difference between the initial phase $\theta_{Lmx1(1)}$ from the time $t_2$ to the time $t_3$ and the initial phase $\theta_{Lx1}$ before the time $t_2$. Relationships among these variables can be respectively expressed by equation (37) and equation (38).

$$\theta_{Lx1(2)} = \theta_{Lx1} + \Delta\theta_{LTT1} \quad (37)$$

$$\theta_{Lmx1(1)} = \theta_{Lx1} + \Delta\theta_{LTR1} \quad (38)$$

Further, phase differences $\Delta\theta_{LTT2}$, $\Delta\theta_{LRR2}$, and $\Delta\theta_{LTR2}$ are phase differences concerning the device 2. The phase difference $\Delta\theta_{LTT2}$ is a difference between the initial phase $\theta_{Lx2(2)}$ from the time $t_2$ to the time $t_3$ and the initial phase $\theta_{Lx2}$ before the time $t_1$ in the signal S5. The phase difference $\Delta\theta_{LRR2}$ is a difference between the initial phase $\theta_{Lmx2(2)}$ from the time $t_3$ to the time $t_4$ and the initial phase $\theta_{Lmx2(1)}$ from the time $t_1$ to the time $t_2$ in the signal S5. The phase difference $\Delta\theta_{LTR2}$ is a difference between the initial phase $\theta_{Lmx2(1)}$ from the time $t_1$ to the time $t_2$ and the initial phase $\theta_{Lx2}$ before the time $t_1$ in the signal S5. Relationships among these variables can be respectively expressed by equation (39) to equation (41) as follows.

$$\theta_{Lx2(2)} = \theta_{Lx2} + \Delta\theta_{LTT2} \quad (39)$$

$$\theta_{Lmx2(1)} = \theta_{Lx2} + \Delta\theta_{LTR2} \quad (40)$$

$$\theta_{Lmx2(2)} = \theta_{Lmx2(1)} + \Delta\theta_{LRR2} = \theta_{Lx2} + \Delta\theta_{LTR2} + \Delta\theta_{LRR2} \quad (41)$$

As will be described later, of the phase differences, $\Delta\theta_{LTT1}$, $\Delta\theta_{LTT2}$, and $\Delta\theta_{LRR2}$ can be directly measured by mpl1 and mpl2. On the other hand, $\Delta\theta_{LTR1}$ in equation (38) and $\Delta\theta_{LTR2}$ in equation (40) cannot be directly measured. Therefore, in the present embodiment, mpl1 and mpl2 obtain $\Delta\theta_{LTR1}$ and $\Delta\theta_{LTR2}$ by measuring the phase differences relating to $\Delta\theta_{LTR1}$ and $\Delta\theta_{LTR2}$ as will be described later.

Here, in order to show a concept of an initial phase measurement method, $\Delta\theta_{LTR1}$ and $\Delta\theta_{LTR2}$ will be described as measurable.

When equation (37) to equation (41) described above are substituted into $\theta_{LSUM}$ in equation (25) described above, $\theta_{LSUM}$ in equation (36) described above is given by equation (42) as follows.

$$\theta_{LSUM} = -2(\Delta\theta_{LTR1} + \Delta\theta_{LTR2}) + 2 \times \Delta\theta_{LTT2} + \Delta\theta_{LTT1} - \Delta\theta_{LRR2} \quad (42)$$

Next, $\theta_{HSUM}$ in the high frequency shown in equation (33) is obtained.

Figure 8:
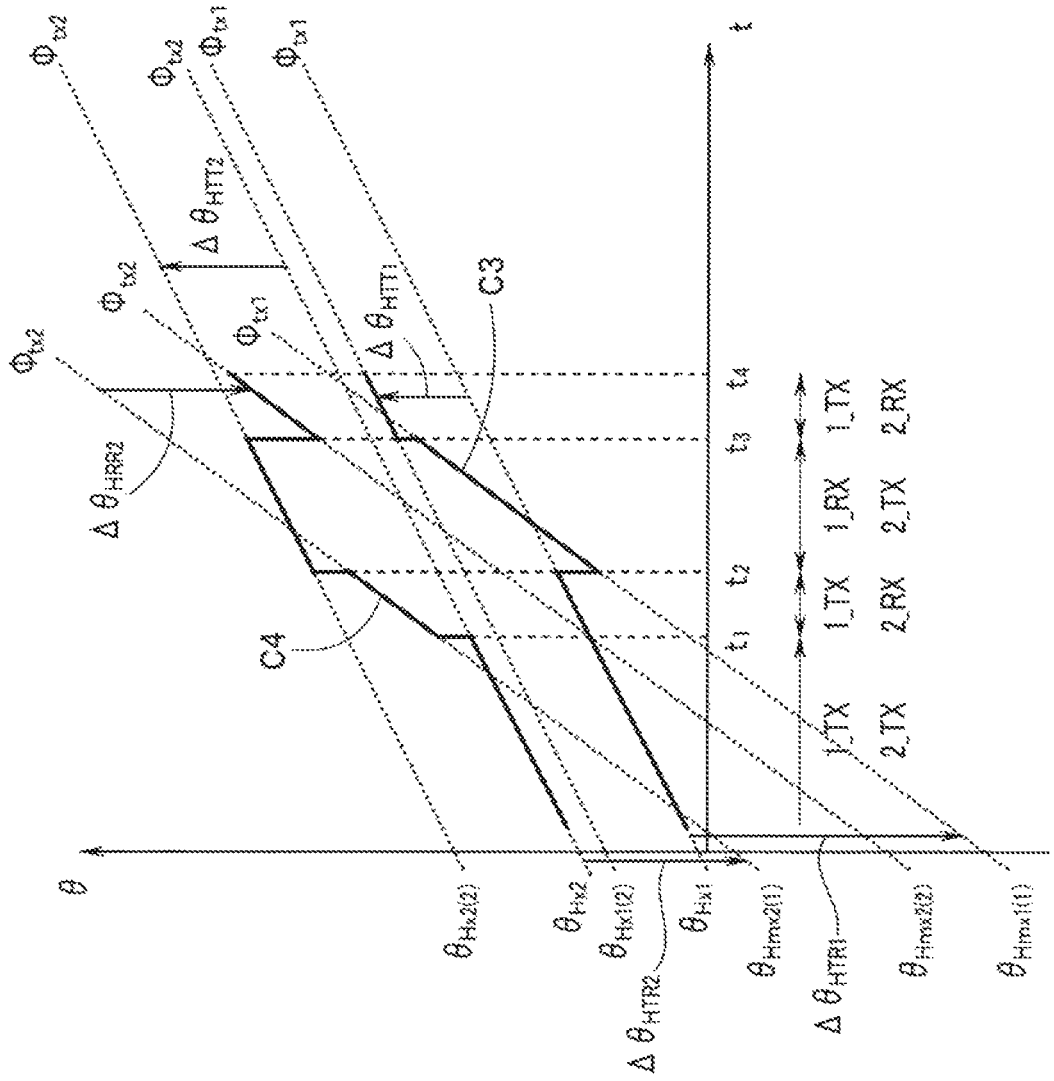
FIG. 8 is a graph in which arrows explaining information on three kinds of phase differences are added to a graph similar to the graph of FIG. 4.

A graph in FIG. 8 shows a transition of the initial phases of the signals S2 and S5 in the distance measurement sequence of the high frequency, and explains three kinds of phase differences that are necessary for calculation of a first term in equation (36) described above, similarly to FIG. 7. FIG. 8 is a diagram in which arrows explaining information on the three kinds of phase differences are added to a graph similar to the graph in FIG. 4. Note that the graph in FIG. 8 illustrates an example having a characteristic of a same shape as the shape of the graph in FIG. 7 to simplify explanation, but does not have to have the characteristic of the same shape as in FIG. 7.

The initial phase of the signal S2 from mpl1 of the device 1 changes to an initial phase $\theta_{Hx1}$ before a time $t_2$, an initial phase $\theta_{Hmx1(1)}$ from the time $t_2$ to a time $t_3$, and an initial phase $\theta_{Hx1(2)}$ from the time $t_3$ to a time $t_4$. The initial phase of the signal S5 from mpl2 of the device 2 changes to an initial phase $\theta_{Hx2}$ before a time $t_1$, an initial phase $\theta_{Hmx2(1)}$ from the time $t_1$ to the time $t_2$, an initial phase $\theta_{Hx2(2)}$ from the time $t_2$ to the time $t_3$, and an initial phase $\theta_{Hmx2(2)}$ from the time $t_3$ to the time $t_4$.

Phase differences $\Delta\theta_{HTT1}$ and $\Delta\theta_{HTR1}$ are phase differences concerning the device 1. The phase difference $\Delta\theta_{HTR1}$ is a difference between the initial phase $\theta_{Hx1(2)}$ from the time $t_3$ to the time $t_4$ and the initial phase $\phi_{Hx1}$ before the time $t_2$ in the signal S2. The phase difference $\Delta\theta_{HTR1}$ is a difference between the initial phase $\theta_{Hmx1(1)}$ from the time $t_2$ to the time $t_3$ and the initial phase $\theta_{Hx1}$ before the time $t_2$ in the signal S2. Relationships among these variables can be respectively expressed by equation (43) and equation (44) as follows.

$$\theta_{Hx1(2)} = \theta_{Hx1} + \Delta\theta_{HTT1} \quad (43)$$

$$\theta_{Hmx1(1)} = \theta_{Hx1} + \Delta\theta_{HTR1} \quad (44)$$

Likewise, phase differences $\Delta\theta_{HTT2}$, $\Delta\theta_{HRR2}$, and $\Delta\theta_{HTR2}$ are phase differences concerning the device 2. The phase difference $\Delta\theta_{HTT2}$ is a difference between the initial phase $\theta_{Hx2(2)}$ from the time $t_2$ to the time $t_3$ and the initial phase $\theta_{Hx2}$ before the time $t_1$ in the signal S5. The phase difference $\Delta\theta_{HRR2}$ is a difference between the initial phase $\theta_{Hmx2(2)}$ from the time $t_3$ to the time $t_4$ and the initial phase $\theta_{Hmx2(1)}$ from the time $t_1$ to the time $t_2$ in the signal S5. The phase difference $\Delta\theta_{HTR2}$ is a difference between the initial phase $\theta_{Hmx2(1)}$ from the time $t_1$ to the time $t_2$ and the initial phase $\theta_{Hx2}$ before the time $t_1$ in the signal S5. Relationships among these variables can be respectively expressed by equation (45) to equation (47) as follows.

$$\theta_{Hx2(2)} = \theta_{Hx2} + \Delta\theta_{HTT2} \quad (45)$$

$$\theta_{Hmx2(1)} = \theta_{Hx2} + \Delta\theta_{HTR2} \quad (46)$$

$$\theta_{Hmx2(2)} = \theta_{Hmx2(1)} + \Delta\theta_{HRR2} = \theta_{Hx2} + \Delta\theta_{HTR2} + \Delta\theta_{HRR2} \quad (47)$$

As in the case of the low frequency, of the above phase differences, $\Delta\theta_{HTT1}$, $\Delta\theta_{HTT2}$, and $\Delta\theta_{HRR2}$ can be directly measured by mpl1 and mpl2. On the other hand, $\Delta\theta_{HTR1}$ in equation (44) and $\Delta\theta_{HTR2}$ in equation (46) cannot be directly measured. Therefore, in the present embodiment, mpl1 and mpl2 obtain $\Delta\theta_{HTR1}$ and $\Delta\theta_{HTR2}$ by measuring the phase differences relating to $\Delta\theta_{HTR1}$ and $\Delta\theta_{HTR2}$ as will be described later.

Here, in order to show a concept of an initial phase measurement method, $\Delta\theta_{HTR1}$ and $\Delta\theta_{HTR2}$ will be described as measurable.

When equation (43) to equation (47) described above are substituted into $\theta_{HSUM}$ in equation (25) described above, $\theta_{HSUM}$ in equation (36) described above is given by equation (48) as follows.

$$\theta_{HSUM} = -2(\Delta\theta_{HTR1} + \Delta\theta_{HTR2}) + 2 \times \Delta\theta_{HTT2} + \Delta\theta_{HTT1} - \Delta\theta_{HRR2} \quad (48)$$

As above, it is possible to obtain the first term in equation (36) described above by equation (42) and equation (48) described above.

In thick line characteristics C1 to C4 in FIG. 7 and FIG. 8, sections where inclinations are small are transmission sections, and sections where inclinations are large are reception sections. Note that when one of the devices 1 and 2 is in the transmission section, the other one is in the reception section. In equation (42) and equation (48) described above, the phase differences $\Delta\theta_{LTT1}$, $\Delta\theta_{LTT2}$, $\Delta\theta_{HTT1}$, and $\Delta\theta_{HTT2}$ express the phase differences between the respective RF signals in the two transmission sections with the reception section sandwiched between the two transmission sections, in the respective devices 1 and 2. The phase differences $\Delta\theta_{LRR2}$, and $\Delta\theta_{HRR2}$ express the phase differences between the respective RF signals of the two reception sections with the transmission section sandwiched between the two reception sections. The phase differences $\Delta\theta_{LTR2}$, $\Delta\theta_{LTR2}$, $\Delta\theta_{HTR1}$ and $\Delta\theta_{HTR2}$ each expresses the phase difference between the respective RF signals of the continuous transmission section and reception section. The former two are the initial phase differences of the same frequency, and the latter two are the initial phase differences of different frequencies. When "the phase difference between the respective RF signals in the two transmission sections" (hereinafter, also referred to as a first phase difference), "the phase difference between the respective RF signals in the two reception sections" (hereinafter, also referred to as a second phase difference), and "the phase difference between the respective RF signals in the continuous transmission section and reception section" (hereinafter, also referred to as a third phase difference) can be obtained, it becomes possible to perform accurate distance measurement by equation (36) described above.

In the present embodiment, the three kinds of phase differences are obtained by mpl1 and mpl2. Information on the obtained phase differences are outputted to operation devices CA1 and CA2 by mpl1 and mpl2. The operation devices CA1 and CA2 may each be configured by a processor using a CPU, FPGA or the like, may operate according to a program stored in a memory not illustrated and control each unit, or may realize a part or all of a function by an electronic circuit of hardware.

The operation devices CA1 and CA2 are respectively given signals S12 and S9 from IFMIX1 and IFMIX2, and detect phases of the signals S12 and S9. The operation device CA1 performs an operation of equation (36) described above to obtain the delay $\tau_R$ and further obtains the distance R, by using phase information obtained from the signal S12 and information on the phase difference from mpl1. Note that in the device 2, the operation device CA2 can also perform an operation of equation (36) described above to obtain the delay $\tau_R$ and further obtain the distance R, by using phase information obtained from the signal S9 and the information on the phase difference from mpl2. Note that the operation devices CA1 and CA2 can respectively perform various kinds of control concerning distance measurement in the devices 1 and 2, for example, frequency setting, timing control and the like in the distance measurement sequence.

(Specific Configuration)

Figure 9:
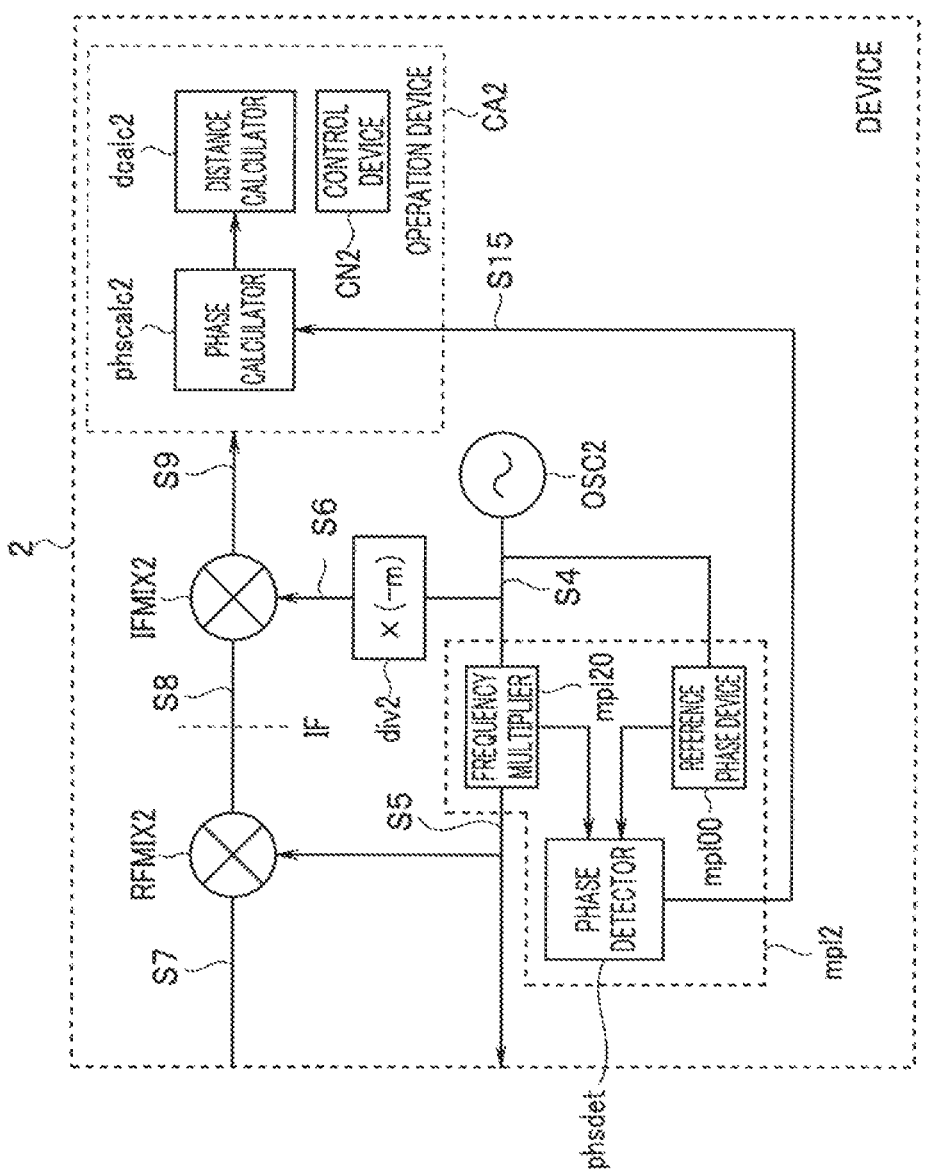
FIG. 9 is a block diagram illustrating the distance measuring device including the phase fluctuation detecting device and the phase correcting device according to the embodiment.

FIG. 9 is a block diagram illustrating the distance measuring device including the phase fluctuation detecting device and the phase correcting device according to the embodiment, and illustrates a specific configuration of mpl2 that calculates the above described three kinds of phase differences in the device 2. Further, the configuration of mpl1 of the device 1 is also similar to the configuration in FIG. 9, and illustration and explanation will be omitted. Note that in FIG. 9, the phase fluctuation detecting device is configured by OSC2 and mpl2, and the phase correcting device is configured by OSC2, mpl2, a phase calculator phscalc2, and a distance calculator dcalc2. As described above, it is possible to use the phase fluctuation detecting device and the phase correcting device not only in the distance measuring device, but also in various devices that detect phases of inputted signals, and in that case, in the phase correcting device, other circuits that correct the phase of the input signal according to the fluctuation amount of the initial phase by using the output of mpl2 are adopted, in place of the phase calculator phscalc2 and the distance calculator dcalc2.

A frequency multiplier mpl20, a reference phase device mp100, and a phase detector phsdet configure mpl2. The frequency multiplier mpl20 has a same function as the function of mpl2A in FIG. 2. In other words, the frequency multiplier mpl20 configures a local oscillator, is given a signal S4 that is an oscillation output of OSC2, multiplies a frequency of the signal S4 by a predetermined amount, generates and outputs the signal S5 that is a local oscillation signal. The signal S5 is given to RFMIX2 as an LO signal in the reception section of the distance measurement, and is transmitted as the single wave signal in the transmission section of the distance measurement. The frequency multiplier mpl20 can also output information on a phase of the signal S5 to the phase detector phsdet.

The reference phase device mp100 is given the signal S4 from OSC2. As described above, in the distance measurement sequence, a frequency of the signal S5 from the frequency multiplier mpl20 changes, and an initial phase of the signal S5 also changes at the timing of the change of the frequency. The reference phase device mp100 can output information on a phase that changes according to the initial phase and an initial frequency before the frequency of the signal S5 from the frequency multiplier mpl20 is changed, that is, a phase for obtaining the reference phase (hereinafter, referred to as a quasi-reference phase), based on the signal S4. The reference phase device mp100 outputs the obtained quasi-reference phase to the phase detector phsdet.

The phase detector phsdet in the frequency multiplier mpl2 obtains the above described three kinds of phase differences based on the inputted information, and outputs information S15 of the phase differences to the operation device CA2.

The operation device CA2 is configured by a phase calculator phscalc2, a distance calculator dcalc2 and a control device CN2. The control device CN2 controls operations of the phase calculator phscalc2 and the distance calculator dcalc2 that configure a correction circuit, and controls mpl2 and div2. The control device CN2 is capable of frequency control, timing control and the like concerning distance measurement in the device 2, and also sets information on $I_0$, $I_2$, $F_0$, $F_2$ and the like that will be described later, for example.

The phase calculator phscalc2 obtains $\theta_{LSUM}$ and $\theta_{HSUM}$ of equation (36) described above and outputs $\theta_{LSUM}$ and $\theta_{HSUM}$ to the distance calculator dcalc2, by using the output of the phase detector phsdet. The operation device CA2 is also given a signal S9 from IFMIX2, and the distance calculator dcalc2 obtains the delay $\tau_R$ by an operation of equation (36) described above from the output of the phase calculator phscalc2 and the signal S9, and further calculates the distance R.

Figure 10:
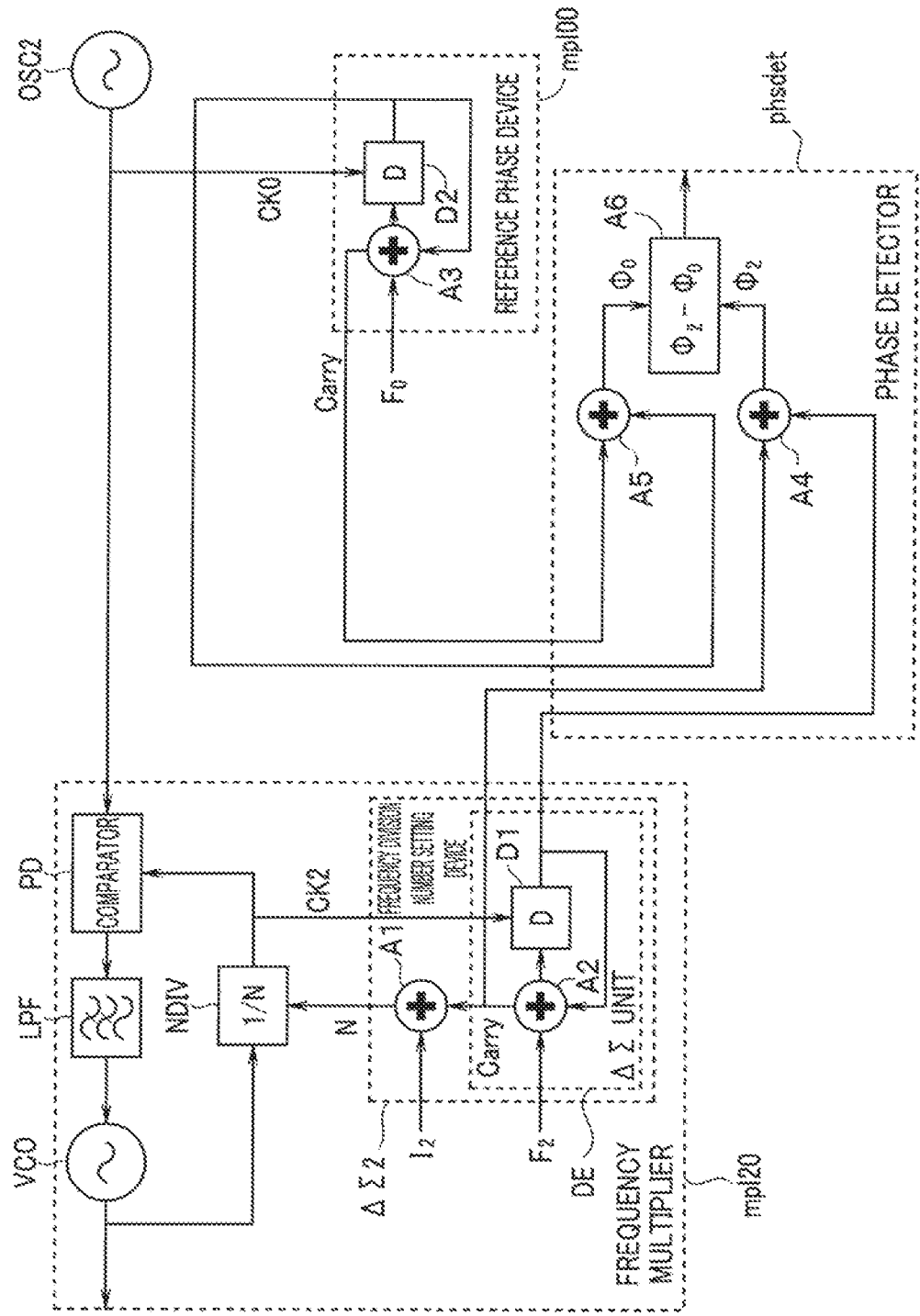
FIG. 10 is a circuit diagram illustrating a more specific configuration of mp12.

FIG. 10 is a circuit diagram illustrating a more specific configuration of mpl2. Note that a configuration of mpl1 of the device 1 is also similar to the configuration in FIG. 10, and illustration and explanation will be omitted.

A frequency multiplier mpl20 includes a circuit part of a frequency multiplier of an ordinary configuration having a PLL including a voltage-controlled oscillator (VCO). In other words, the frequency multiplier mpl20 has a PLL configured by a phase comparator PD configured to perform comparison of phases, a low pass filter LPF, a voltage-controlled oscillator VCO and a 1/N frequency divider NDIV. The frequency multiplier mpl20 includes a frequency division number setting device ΔΣ2 configured to set a frequency division number. In the present embodiment, a fractional PLL that can set the frequency division number N at a rational number is adopted.

An output of the voltage-controlled oscillator VCO is supplied to the frequency divider NDIV and is frequency-divided into 1/N. An output of the frequency divider NDIV is given to the phase comparator PD, and the phase comparator PD performs phase comparison of the frequency division output of the frequency divider NDIV and a signal S4 that is an oscillation output of OSC2, and gives a comparison result to the voltage-controlled oscillator VCO via the low pass filter LPF. By the PLL, synchronization is achieved so that the frequency division output that is inputted to the phase comparator PD and a frequency of the signal S4 are matched with each other. In the state where the PLL achieves synchronization, a frequency of an output signal S5 from the voltage-controlled oscillator VCO is N times as large as the frequency of the oscillation output (signal S4) of OSC2.

Since mpl20 generates an LO signal based on the signal S4 that is the oscillation output of OSC2, OSC2 will be also referred to as a reference oscillator OSC2, an oscillation output of the reference oscillator OSC2 will be also referred to as a reference clock, and a frequency of the reference clock will be also referred to as a reference frequency in the following explanation. In the fractional PLL, the reference frequency of the reference clock is multiplied by a rational number. The frequency division number N of the frequency divider NDIV is an integer value, and the reference frequency can be multiplied by a rational number on average by, for example, adding and subtracting 1 to and from the frequency division number N at a predetermined interval. When the frequency division number multiplied by a rational number is set as E[N], an integer value of E[N] is set as $I_2$, and a decimal value of E[N] is set as $F_2$, $E[N]=I_2 \cdot F_2$ is established.

The frequency division number that is set to the frequency divider NDIV like this is controlled by the division number setting device ΔΣ2. To the division number setting device ΔΣ2, the integer portion input $I_2$ and the decimal portion input (fractional input) $F_2$ are inputted. The division number setting device ΔΣ2 is configured by an adder A1 configured to output the frequency division number N to the frequency divider NDIV, and a ΔΣ unit DE configured to generate Carry (carry) at timing corresponding to a size of the decimal portion to generate a numerical value to be added to the frequency division number N. The adder A1 directly outputs $I_2$ as the frequency division number N in a period in which Carry is not generated from the ΔΣ unit DE as a first phase integrator, and adds a numerical value of Carry to $I_2$ and outputs an addition result as the frequency division number N only when Carry is generated from the ΔΣ unit DE.

The ΔΣ unit DE is a block reflecting a decimal setting, and is configured by an adder A2 and a delay device D1. The delay device D1 is given a clock CK2 that is a frequency division output of the frequency divider NDIV. Note that a phase of the clock CK2 is obtained by frequency-dividing the output signal of the voltage-controlled oscillator VCO by an integer, and corresponds to a phase of the output of the voltage-controlled oscillator VCO. In other words, the frequency division number setting device ΔΣ2 functions as a first phase detector that detects a phase of a local oscillation signal.

If the PLL generates a frequency obtained by multiplying the reference clock by an integer N, phases of a reference clock CK0 and the clock CK2 correspond to each other in the synchronizing state of the PLL. However, when an output frequency of the voltage-controlled oscillator VCO is not an integer multiple of the reference clock CK0, a deviation occurs to the phase of the clock CK2 from the frequency divider NDIV in which the frequency division number is an integer and the phase of the reference clock. An amount of the deviation is a phase difference between a phase of the output of the voltage-controlled oscillator VCO that operates with a rational number multiple on average (the phase of the clock CK2) and the reference clock, and corresponds to the size of the decimal portion $F_2$. By integrating the decimal portion $F_2$ at each timing of the clock CK2 by the adder A2 and the delay device D1, Carry from the ΔΣ unit DE is generated at timing necessary to operate the PLL with a rational number multiple $E[N]=I_2 \cdot F_2$ on average.

In other words, the output of the delay device D1 corresponds to a phase of a present output of the voltage-controlled oscillator VCO, and Carry from the adder A2 is generated each time the phase of the output of the voltage-controlled oscillator VCO advances by one period (2π).

A reference phase device mp100 as a second phase integrator obtains a phase (reference phase) of the output of the voltage-controlled oscillator VCO on the precondition that the output frequency of the frequency multiplier mpl20 does not change. Therefore, the reference phase device mp100 may have a same configuration as the configuration of the frequency multiplier mpl20. In a case where the configuration is adopted, it is possible to acquire a quasi-reference phase for obtaining the reference phase by output of the ΔΣ unit DE in a case where the information $I_2$ and $F_2$ for changing the frequency is not changed from initial values $I_0$ and $F_0$ in a rational number multiple of an initial setting.

In the present embodiment, as the reference phase device mp100, only the components necessary to obtain the reference phase of the frequency multiplier mpl20 are adopted. In an example in FIG. 10, the reference phase device mp100 has only similar components as the components of the ΔΣ unit DE of the frequency multiplier mpl20. In other words, the reference phase device mp100 is configured by an adder A3 and a delay device D2. In the reference phase device mp100, a frequency is not changed, and therefore, components concerning the integer portion are not required.

When a fixed value integer portion $I_0$ and a fixed value decimal portion $F_0$ for multiplying the frequency of the reference clock by $k_L$ are assumed to be given to the ΔΣ unit DE for the purpose of initial setting of the frequency multiplier mpl20, the decimal portion $F_0$ is given to the adder A3 of the reference phase device mp100.

Further, for the clock that is given to the delay device D, the reference clock CK0 from the reference oscillator OSC2 is used instead of the clock CK2 that is the oscillation output of the frequency divider NDIV of mpl20. The reference phase device mp100 integrates the decimal portion $F_0$ at periods of the reference clock CK0. The output of the delay device D2 has a phase (quasi-reference phase) that changes similarly to the phase (reference phase) of the output of the frequency multiplier mpl20 using the initial values $I_0$ and $F_0$ at the time of initial setting. In other words, the phase (quasi-reference phase) of the output of the delay device D2 is a phase that changes at a similar change rate to the change rate of the reference phase and differs only in initial phase, with respect to the phase (reference phase) of the output of the frequency multiplier mpl20 at the time of the initial setting.

The output of the delay device D1 of the ΔΣ unit DE of the frequency multiplier mpl20 and Carry from the adder A2 are given to an adder A4 of a phase detector phsdet as a second phase detector. The output of the delay device D2 and Carry from the adder A3 of the reference phase device mpl00 are given to an adder A5 of the phase detector phsdet.

As described above, the output of the delay device D1 of mpl20 corresponds to the output phase of the voltage-controlled oscillator VCO. In other words, the output of the delay device D1 corresponds to the phase $\phi_{tx2}$ shown by thick lines in FIG. 7 and FIG. 8. The output of the delay device D2 of the reference phase device mpl00 is expressed by a straight line of the phase $\phi_{tx2}$ with $\theta_{Lx2}$ or $\theta_{Hx2}$ in FIG. 7 and FIG. 8 as the initial phase. Note that FIG. 7 and FIG. 8 show these phases as simply increasing, but in reality, the outputs of the delay devices D1 and D2 do not exceed $2\pi$. In other words, the phases in FIG. 7 and FIG. 8 can be obtained by adding the value corresponding to $2\pi$ to the outputs of the delay devices D1 and D2 respectively, each time Carry corresponding to $2\pi$ is generated.

The adder A4 of the phase detector phsdet is given the output of the delay device D1 and Carry of the ΔΣ unit DE of mpl20, and adds the output and Carry. In other words, an addition result of A4 is each of phases of present outputs of the frequency multiplier mp120 shown by the thick lines in FIG. 7 and FIG. 8. The adder A5 is given the output of the delay device D2 and Carry of the reference phase device mp100, and adds up the output of the delay device D2 and Carry. In other words, an addition result of A5 shows a quasi-reference phase corresponding to the phase $\phi_{tx2}$ expressed by equation (4), in the case of FIG. 7.

The addition results of the adders A4 and A5 are given to a phase difference calculation unit A6. When the addition results of the adders A4 and A5 are respectively assumed to be phases $\phi_2$ and $\phi_0$, the phase difference calculation unit A6 performs an operation including a difference operation using the phases $\phi_2$ and $\phi_0$ that are acquired at timings independent from each other. Note that the phase difference calculation unit A6 uses the phases $\phi_2$ and $\phi_0$ at times when the output frequencies of the frequency multiplier mpl20 are stabilized in the reception section and the transmission section, in the operation.

Figure 11:
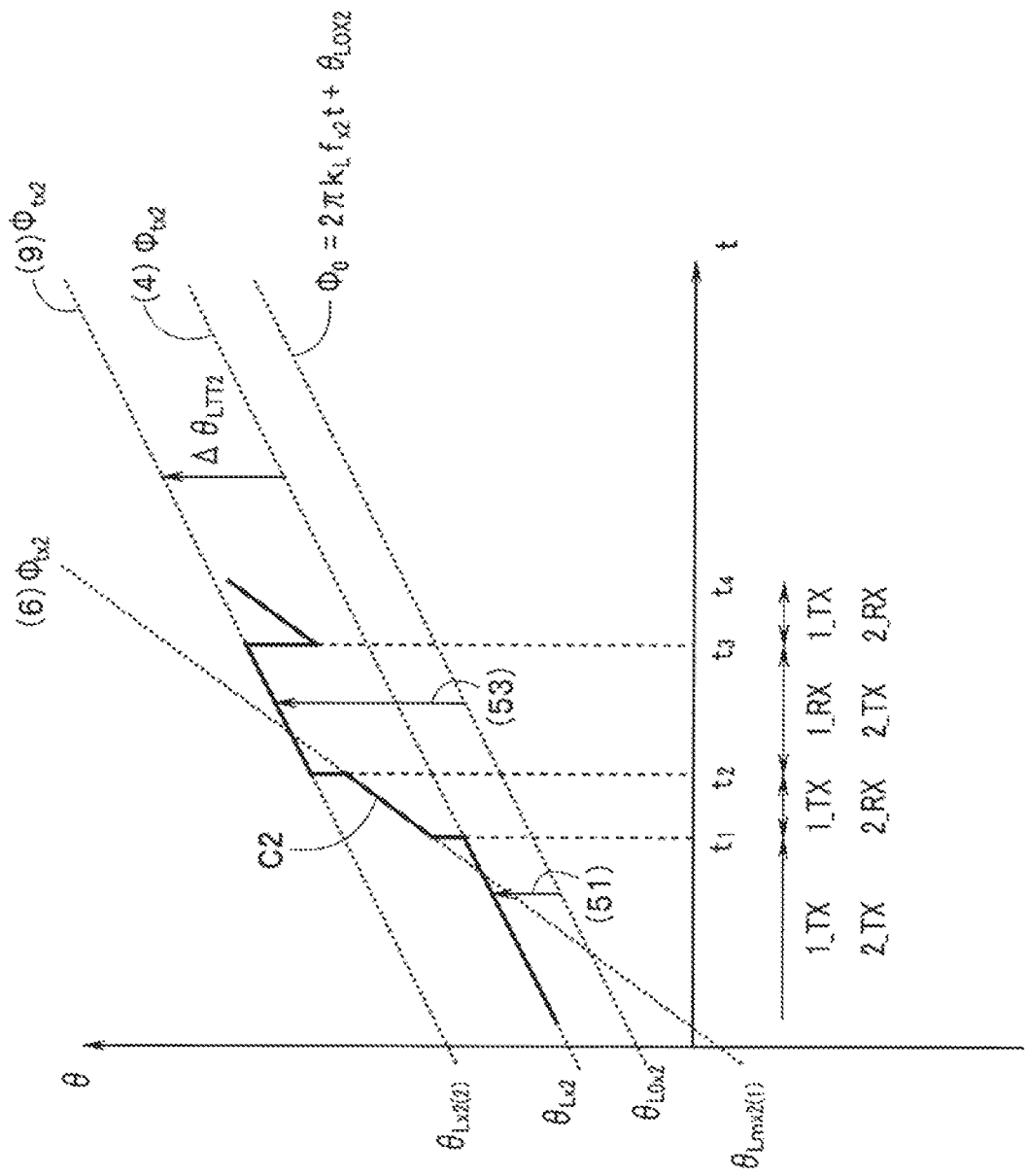
FIG. 11 is a graph by a description method similar to FIG. 7.

Next, an operation of the embodiment that is configured in this way will be described with reference to a graph in FIG. 11. FIG. 11 is a graph by a similar description method as in FIG. 7, has the characteristics concerning the device (device 1A) removed from the graph in FIG. 7, and shows the quasi-reference phase of the output of the adder A5 to which the output of the reference phase device mpl00 is added, by $\phi_0$. It is assumed that mpl2 operates similarly to mpl2A of the device 2A. In other words, the phase of the output of mpl2 of the device 2 is shown by FIG. 11 (characteristic C2) showing a similar characteristic to the characteristic of FIG. 7.

It is assumed that the reference phase device mpl00 and mpl20 have the same frequency at the time of initial setting of the transmission frequency before the time $t_1$, and a similar initial setting to the initial setting of mpl2A described above is performed. Accordingly, a phase $\phi_2$ of an output of mpl20 is equivalent to a right side of equation (4) described above, and is expressed by a thick line characteristic C2 in FIG. 11. In mpl20, $k_L$ in equation (4) means that a rational number multiple E [N]=$I_2 \cdot F_2$. The integer value $I_2$ corresponds to a multiple of 360° ($2\pi$) in phase conversion, and is omitted in a remainder operation for obtaining the phase $\phi_2$. Therefore, in obtaining the phase $\phi_2$ of the output of mpl20, it is not necessary to consider the integer value $I_2$, and only a change in the phase by a decimal value $F_2$ can be obtained. Therefore, as described above, the phase $\phi_2$ of the output of mpl20 is obtained by performing addition of the output of the delay device D1 and Carry from the adder A2, in the adder A4. Note that in the following explanation, the right side of equation (4) including a phase amount by the integer value $I_2$ is directly used, but there is no particular problem.

(Calculation of First Phase Difference)

The phase $\phi_2$ of the output of the adder A4 is given by equation (49) as follows that is similar to the right side of equation (4).

$$\phi_2 = 2\pi k_L f_{x2} t + \theta_{Lx2} \quad (49)$$

In the reference phase device mpl00, a frequency setting in the initial setting is same as the frequency setting in the initial setting of mpl20, but an initial phase differs from the initial phase of mpl20. When the initial phase at the time of a low frequency of the reference phase device mpl00 is $\theta_{L0x2}$, a quasi-reference phase $\phi_0$ of an output of the adder A5 that is obtained from an output of the reference phase device mpl00 is given by equation (50) as follows.

$$\phi_0 = 2\pi k_L f_{x2} t + \theta_{L0x2} \quad (50)$$

Handling of the integer portion IP is assumed to be similar to $\phi_2$, and the integer portion $I_0$ is not detected in the adder A5, but is assumed to be included in equation (50). When $\phi_2 - \phi_0$ is detected in the phase difference calculation unit A6 immediately before the time $t_1$ at which the frequency is switched, $$\phi_2 - \phi_0 = \theta_{Lx2} - \theta_{L0x2} \quad (51)$$

is established, and a difference between the initial phase of the frequency multiplier mpl20 and the initial phase of the reference phase device mpl00 in the initial setting is obtained.

As described above, in the device 2, a period from the time $t_1$ to the time $t_2$ is the reception section, and there is the transmission section again after the time $t_2$, so that an output frequency of the frequency multiplier mpl20 changes, and the initial phase of the output of the voltage-controlled oscillator VCO also changes. The phase $\phi_2$ of the output of the adder A4 output from the time $t_2$ to a time $t_3$ is given by equation (52) as follows that is similar to a right side of equation (9) described above.

$$\phi_2 = 2\pi k_L f_{x2} t + \theta_{Lx2(2)} \quad (52)$$

The quasi reference phase $\phi 0$ of the output of the adder A5 based on the output of the reference phase device mpl00 follows equation (50) described above, because the frequency setting is not changed in the reference phase device mpl00. Accordingly, when $\phi_2 - \phi_0$ is detected by the phase detector Phsdet at a time at which the frequency is stabilized in the transmission section from the time $t_2$ to the time $t_3$, equation (53) as follows is obtained.

$$\phi_2 - \phi_0 = \theta_{Lx2(2)} - \theta_{L0x2} \quad (53)$$

A difference between $\phi_2 - \phi_0$ that is detected immediately before the time $t_1$ and $\phi_2 - \phi_0$ that is detected at the time when the frequency is stabilized in the transmission section from the time $t_2$ to the time $t_3$ shows a phase difference $\Delta\theta_{LTT2}$ that is a change in the initial phase due to a change in the output frequency of the frequency multiplier mpl20. In other words, the phase difference $\Delta\theta_{LTT2}$ is expressed by equation (54) as follows, where a difference between phases of the frequency multiplier mpl20 and the reference phase device mpl00 that are detected at a time to immediately before the time $t_1$ are respectively set as $\phi_2(t_A)$, and $\phi_0(t_A)$, and a difference between phases of the frequency multiplier mpl20 and the reference phase device mpl00 that are detected at a time $t_B$ between the time $t_2$ and the time $t_3$ are respectively set as $\phi_2(t_B)$, and $\phi_0(t_B)$.

$$\phi_2(t_B)-\phi_0(t_B)-\{\phi_2(t_A)-\phi_0(t_A)\}=\Delta\theta_{LTT2} \quad (54)$$

The phase difference calculation unit A6 obtains a phase difference $\phi_2(t_A)$ $\phi_0(t_A)$ of the frequency multiplier mpl20 and the reference phase device mpl00 that is detected at the time $t_A$, obtains a phase difference $\phi_2(t_B)-\phi_0(t_B)$ of the frequency multiplier mpl20 and the reference phase device mpl00 that is detected at the time $t_B$, and obtains a difference of both the phase differences, whereby the phase difference calculation unit A6 can detect $\Delta\theta_{LTT2}$ that is a change in the initial phase of the frequency multiplier mpl20, that is, a first phase difference ("a phase difference between the respective RF signals in the two transmission sections").

Note that from the phase difference calculation unit A6 of the device 1 not illustrated, $\Delta\theta_{LTT1}$ is obtained by a similar method to the method described above.

(Calculation of Second Phase Difference)

Figure 12:
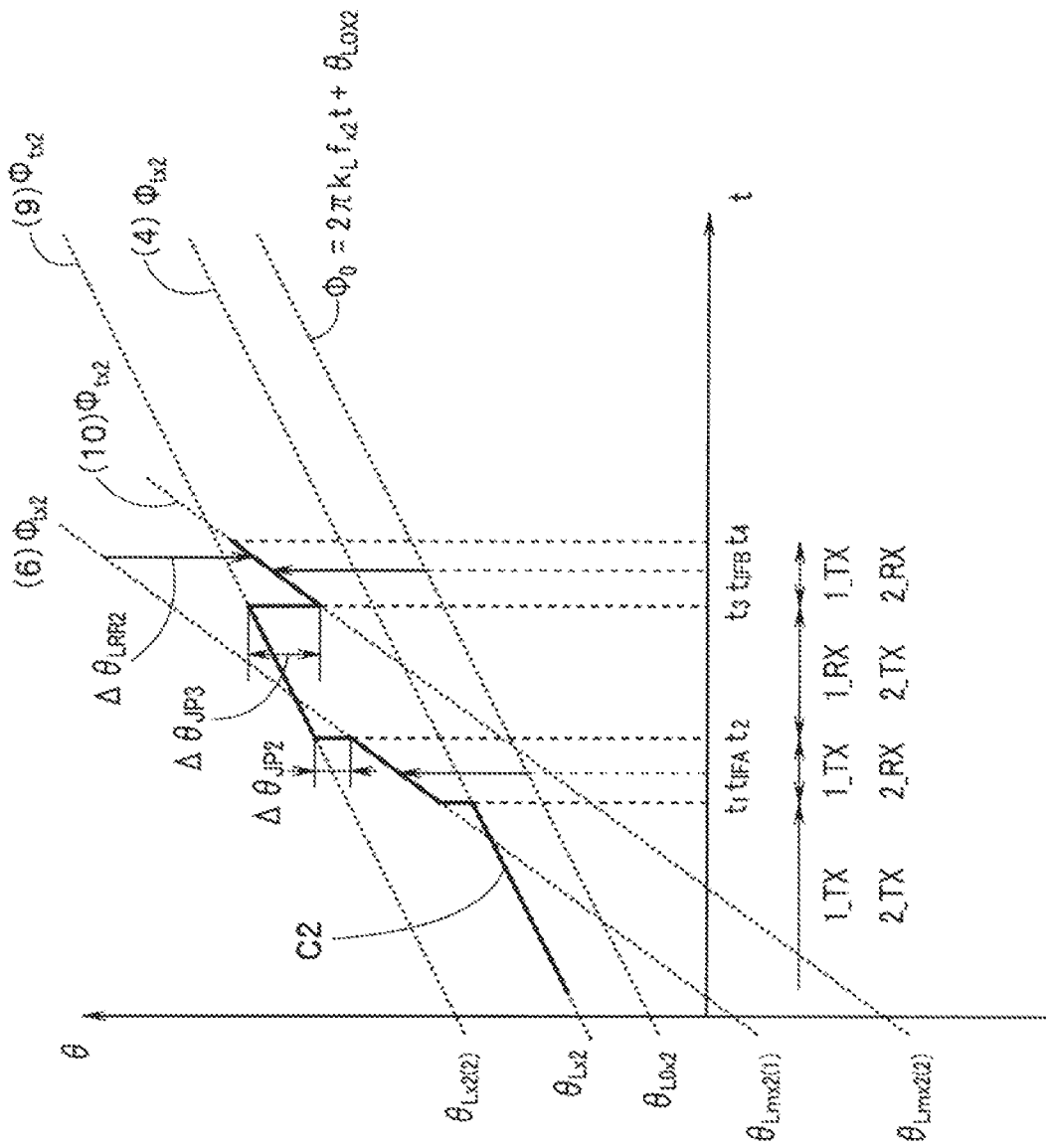
FIG. 12 is a graph similar to FIG. 11.

Next, with reference to FIG. 12, FIG. 13 and FIG. 14, a method for detecting "a phase difference between the respective RF signals in the two reception sections" that is a second phase difference will be described. FIG. 12 is a similar graph to the graph in FIG. 11. In other words, in FIG. 12, the characteristic concerning the device 1 (device 1A) is removed from the graph in FIG. 7, and FIG. 12 shows the quasi-reference phase $\phi_0$ of the output of the adder A5 to which the output of the reference phase device mpl00 is added. It is assumed that mpl2 operates similarly to mpl2A of the device 2A. In other words, a phase of the output of mpl2 of the device 2 is shown by a characteristic C2 in FIG. 12.

A phase $\phi_{tx2}(t)$ of an LO signal from the frequency multiplier mpl20 in a reception section of the device 2 from a time $t_3$ to a time $t_4$ is detected by the adder A4. A phase $\phi_2(t)$ of the output of the adder A4 in this case is expressed by equation (55) as follows that is similar to the right side of equation (10) described above.

$$\phi_2(t)=\phi_{tx2}(t)=2\pi(k_L+m)f_{x2}t+\theta_{Lmx2(2)} \quad (55)$$

Here, $\theta_{Lmx2(2)}$ is an initial phase of the output signal S5 of mpl20 in a section from a time $t_3$ to a time $t_4$. An initial phase of the output signal S5 of mpl20 in a section from a time $t_1$ to a time $t_2$ is set as $\theta_{Lmx2(1)}$, a phase jump amount at a time of the device 2 transitions from reception to transmission is set as $\Delta\theta_{JP2}$, and a phase jump amount at a time of the device 2 transitioning from transmission to reception is set as $\Delta\theta_{JP3}$. If there is no change in the frequency, a total of the phase jump amounts $\Delta\theta_{JP2}$ and $\Delta\theta_{JP3}$ is equal to a difference between $\theta_{Lmx2(2)}$ and $\theta_{Lmx2(1)}$, and when the frequency change is taken into consideration, a relationship between $\theta_{Lmx2(2)}$ and $\theta_{Lmx2(1)}$ is expressed by equation (56) as follows.

$$\theta_{Lmx2(2)}-\theta_{Lmx2(1)}=-mf_{x2}\times(t_3-t_2)+\Delta\theta_{JP2}+\Delta\theta_{JP3} \quad (56)$$

In FIG. 12, $\phi_0$ also represents a quasi-reference phase obtained from the output of the reference phase device mpl00. FIG. 13 is an explanatory diagram for explaining a difference between a phase $\phi_{tx2}$ of mpl20 and a quasi-reference phase $\phi_0$ obtained from the output of the reference phase device mpl00.

Figure 13:
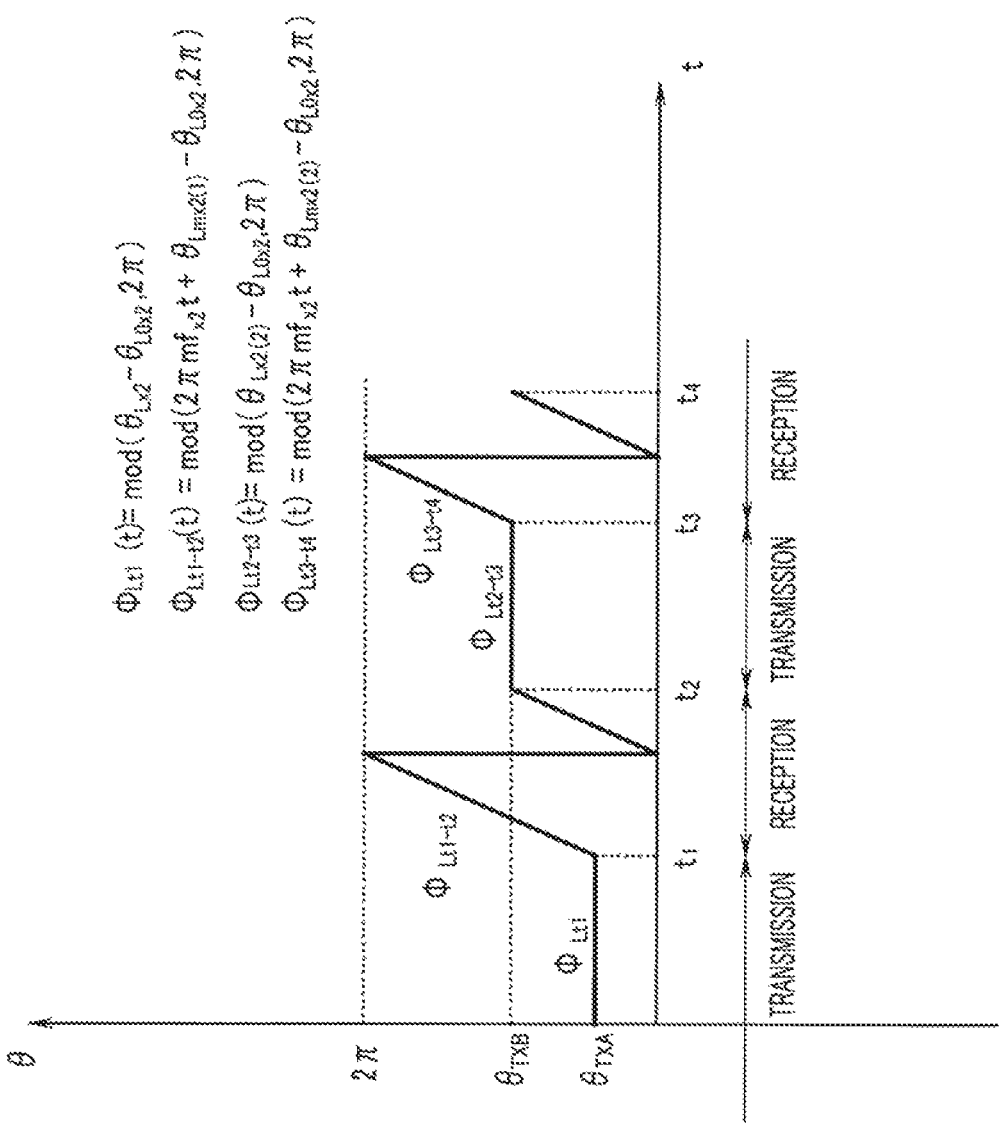
FIG. 13 is an explanatory diagram for explaining a difference between a phase $\phi_{tx2}$ of mp120 and a quasi-reference phase $\phi_0$ obtained from an output of a reference phase device mp100.

FIG. 13 shows a value obtained by performing remainder calculation of $2\pi$ for a phase difference between the phase $\phi_{tx2}(\phi_2)$ and the quasi-reference phase $\phi_0$. Note that the remainder is applied to simplify explanation of a phase difference detection method of a reception state. To simplify the explanation, $\Delta\theta_{JP2}=\Delta\theta_{JP3}=0$ [rad] is set.

In other words, a waveform in FIG. 13 shows a change in $\phi_2$ in a case of the quasi-reference phase $\phi_0$ being set as a reference. When a phase in a transmission state (initial setting state) before a time t1 is set as $\phi_{Lt1}$, a phase in a reception section from the time $t_1$ to a time $t_2$ is set as $\phi_{Lt1-t2}(t)$, a phase in a transmission section from the time $t_2$ to a time $t_3$ is set as $\phi_{Lt2-t3}(t)$, and a phase in a reception section from the time $t_3$ to a time $t_1$ is set as $\phi_{Lt3-t4}(t)$, waveforms showing the phase differences in the respective sections in FIG. 13 can be respectively expressed by equation (57) to equation (60) as follows. Note that an IF frequency $f_{IF2}$ of the device 2 is a frequency difference $mf_{x2}$ [Hz] between an LO signal at a transmission time and an LO signal at a reception time, and equation (61) as follows is established.

$$\phi_{Lt1}(t)=\text{mod}(\theta_{Lx2}-\theta_{LOx2},2\pi)=\theta_{TXA} \quad (57)$$

$$\phi_{Ltx1-t2}(t)=\text{mod}(2\pi mf_{x2}t+\theta_{Lmx2(1)}-\theta_{LOx2},2\pi)=\text{mod}(2\pi f_{IF2}t+\theta_{Lmx2(1)}-\theta_{LOx2},2\pi) \quad (58)$$

$$\phi_{Lt2-t3}(t)=\text{mod}(\theta_{Lx2(2)}-\theta_{LOx2}2\pi)=\theta_{TXB} \quad (59)$$

$$\phi_{Lt3-t4}(t)=\text{mod}(2\pi mf_{x2}t+\theta_{Lmx2(2)}-\theta_{LOx2},2\pi)=\text{mod}(2\pi f_{IF2}t+\theta_{Lmx2(2)}-\theta_{LOx2},2\pi) \quad (60)$$

$$f_{IF2}=mf_{x2} \quad (61)$$

As shown in FIG. 13, a phase difference between the phase of the output of mpl20 and the quasi-reference phase is constant in the transmission sections, and changes at a change rate of an IF angular frequency ($2\pi mf_{x2}$) in the reception sections. Here, a case where the reception state does not end at the time $t_2$, and reception is continued until the time $t_4$ is considered. In this case, equation (58) described above is also applied to a section from the time $t_2$ to the time $t_4$.

Figure 14:
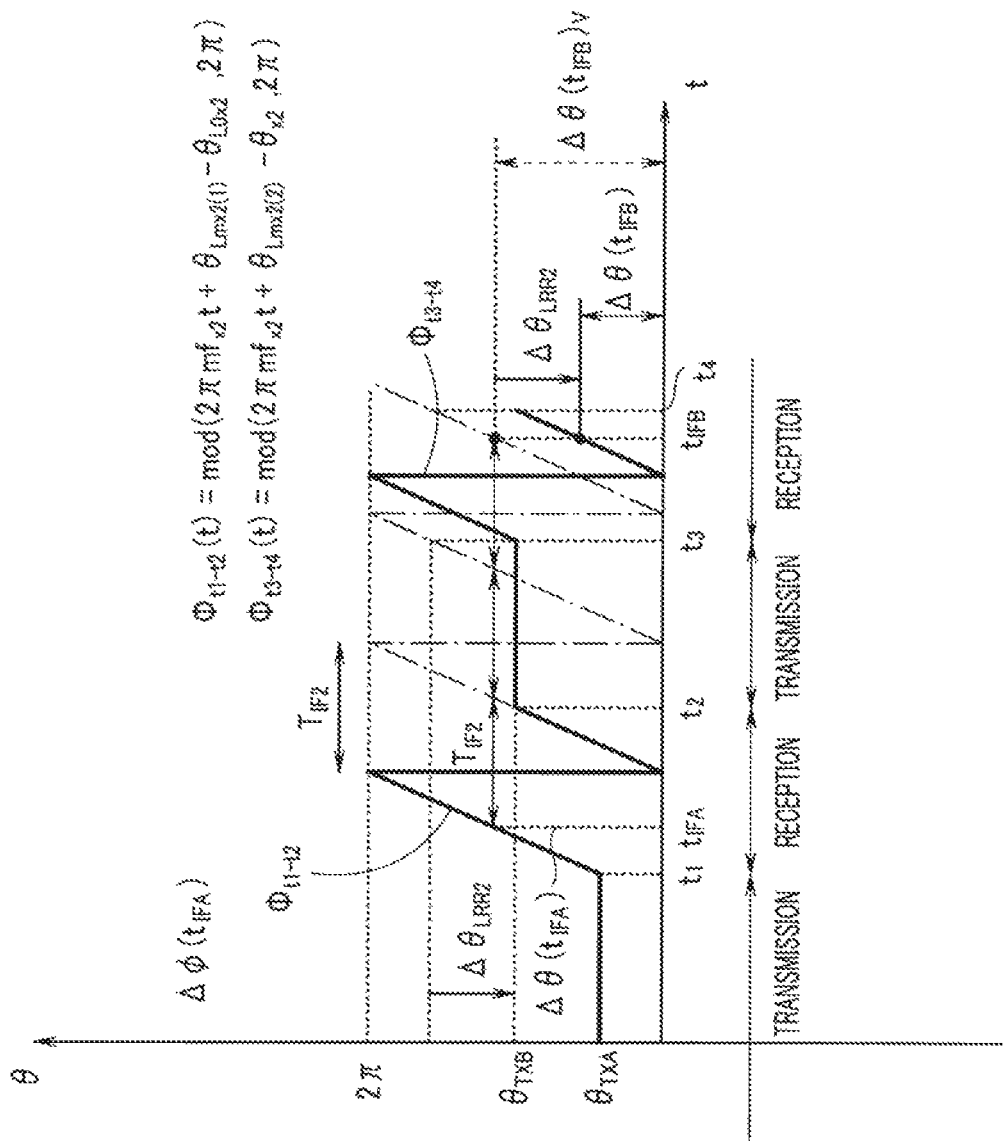
FIG. 14 is an explanatory diagram shown by adding a waveform of a phase difference to which equation (58) is applied, to a waveform of a phase difference of FIG. 13, by a dash-dotted line.

FIG. 14 is an explanatory diagram illustrating waveforms of phase differences to which equation (58) is applied by adding the waveforms by a dish-dotted line to the waveforms of the phase differences in FIG. 13. A time period (one period) $T_{IF2}$ in which the phase changes from 0 [rad] to $2\pi$ [rad] is 1/IF frequency, that is, $$T_{IF2}=1/f_{IF2} \quad (62).$$

When an arbitrary time when the frequency is stabilized in the reception section from a time $t_1$ to a time $t_2$ is set as $t_{IFA}$, if reception of the signal of the frequency $f_{IF2}$ is continued thereafter, the phase of the output of mpl20 has a same value at each time period $T_{IF2}$, as shown by the dash-dotted line in FIG. 14. In other words, a phase difference between the phase of the output of mpl20, the frequency of which is assumed not to change and the quasi-reference phase has a same value at each time period $T_{IF2}$ from the time $t_{IFA}$.

Accordingly, when a difference between the phase $\phi_2$ of the output of mpl20 and the quasi-reference phase $\phi_0$ obtained in the phase difference calculation unit A6, if a time $t_{IFB}$ is assumed to be a time after an integer multiple of $T_{IF2}$ from the time $t_{IFA}$, in the section from a time $t_3$ to a time $t_4$ in FIG. 14, and a phase difference between the phase of the output of mpl20 detected at the time $t_{IFB}$ and the quasi-reference phase is set as $\Delta\theta(t_{IFB})v$ (dashed line), a phase difference $\Delta\theta(t_{IFA})$ and a phase difference $\Delta\theta(t_{IFB})v$ (dashed line) have a same value.

However, since the frequency changes in the reception section from a time $t_2$ to the time $t_3$ in reality, the phase of the output of mpl20 changes according to equation (60), and the phase difference $\Delta\theta(t_{IFB})$ at the time $t_{IFB}$ has a different value from the value of the phase difference $\Delta\theta(t_{IFA})$.

The difference of the phase differences in the case of receiving the frequency change and the case of not receiving the frequency change in the section from the time $t_2$ to the time $t_3$ is due to the fact that the initial phase changes with the frequency change in the section from the time $t_2$ to the time $t_3$ because there is no change in the frequency in the two reception sections. In other words, an initial phase fluctuation amount $\Delta\theta_{LRR2}=\Delta\theta(t_{IFB})-\Delta\theta(t_{IFB})v$ is established. In the operation, the quasi-reference phase is cancelled out, and therefore, the initial phase fluctuation amount $\Delta\theta_{LRR2}$ is obtained by equation (63) as follows using $\phi_{Lt3\text{-}t4}(t_{IFB})$ that is $\phi_2$ from the adder A4 at the time $t_{IFB}$, and $\phi_{Lt1\text{-}t2}(t_{IFA})$ that is $\phi_2$ from the adder A4 at the time $t_{IFA}$.

$$\Delta\theta_{LRR2}=\phi_{Lt3\text{-}t4}(t_{IFB})-\phi_{Lt1\text{-}t2}(t_{IFA}) \quad (63)$$

Note that equation (63) described above is obtained by setting both the phase jumps $\Delta\theta_{JP2}$, and $\Delta\theta_{JP3}$ as 0 [rad]. However, as is obvious from FIG. 12, the phase $\phi_{Lt3\text{-}t4}(t_{IFB})$ reflects $\Delta\theta_{JP2}+\Delta\theta_{JP3}$, and even when the phase jumps $\Delta\theta_{JP2}$, and $\Delta\theta_{JP3}$ are not 0 [rad], an initial phase fluctuation amount $\Delta\theta_{LRR2}$ is obtained by equation (63) described above.

In other words, in the present embodiment, the phase difference calculation unit A6 performs an operation of a difference between the output of the adder A4 at the time $t_{IFA}$ in the first reception section, and the output of the adder A4 at the time $t_{IFB}$ in the second reception section after a time period of an integer multiple of $T_{IF2}$ from the time $t_{IFA}$, or the phase difference calculation unit A6 obtains a difference between $\phi_2$-$\phi_0$ at the time $t_{IFA}$ and $\phi_2$-$\phi_0$ at the time $t_{IFB}$, and thereby it is possible to detect the fluctuation amount $\Delta\theta_{LRR2}$ of the initial phase. In this way, it is possible to detect "the phase difference between the respective RF signals of the two reception sections" that is the second phase difference.

Note that from the phase difference calculation unit A6 of the device 1 not illustrated, a $\Delta\theta_{LRR1}$ is obtained by a similar method to the method described above.

(Calculation of Third Phase Difference)

Figure 15:
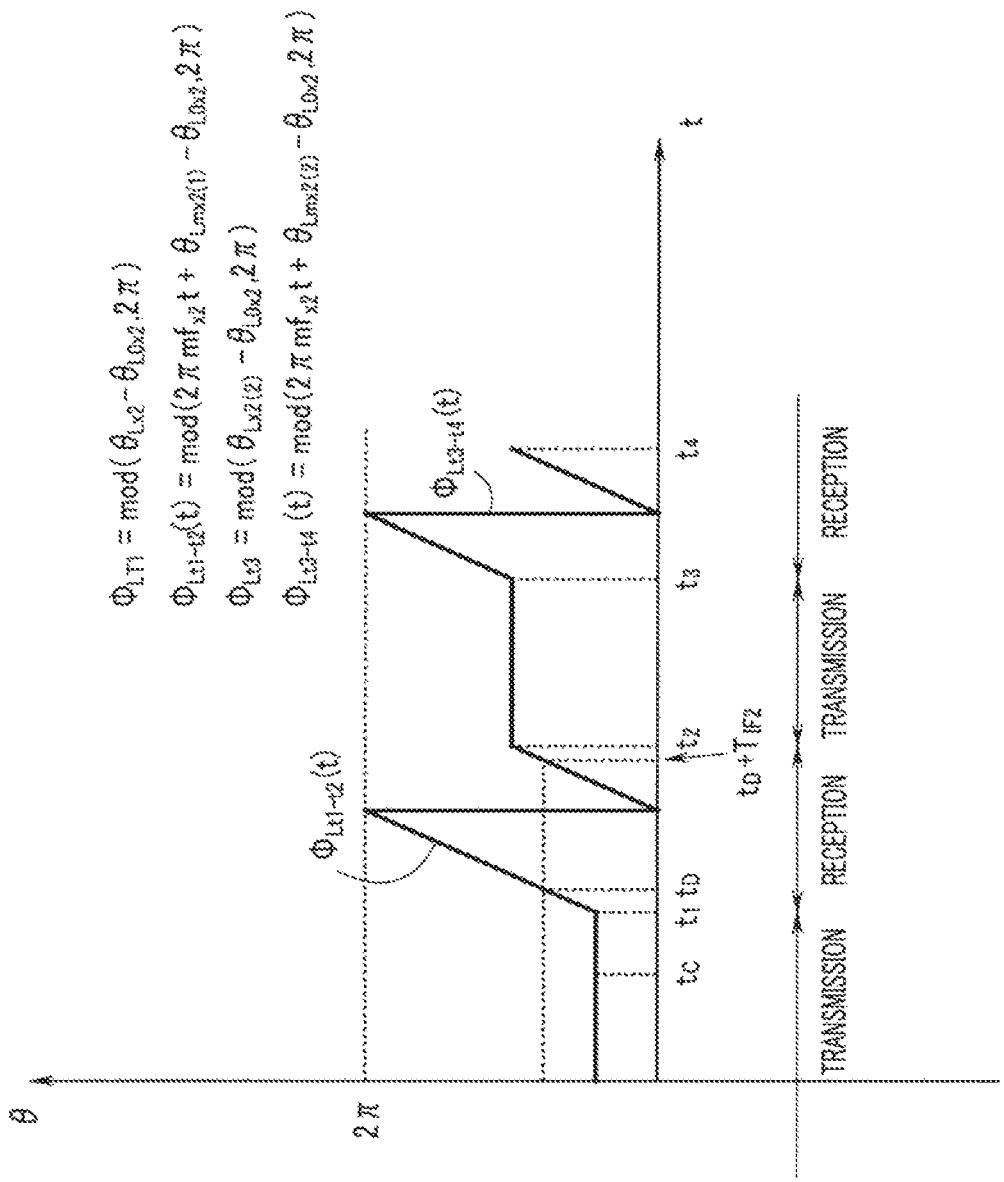
FIG. 15 is an explanatory diagram similar to FIG. 13.

Next, with reference to FIG. 15, a method for detecting "a phase difference between respective RF signals in the transmission section and the reception section that are continuous" that is a third phase difference will be described. FIG. 15 is a similar explanatory diagram to the diagram in FIG. 13. Note that the third phase difference is phase differences $\Delta\theta_{LTR1}$, $\Delta\theta_{LTR2}$, $\Delta\theta_{HTR1}$, and $\Delta\theta_{HTR2}$ in FIG. 7 and FIG. 8. Of the phase differences, the phase difference $\Delta\theta_{LTR2}$ concerning transition from the section before a time $t_1$ of the device 2 to the reception section from the time $t_1$ to a time $t_2$ will be described hereinafter as an example, but as for the other cases, the phase differences can be similarly obtained.

FIG. 15 is a diagram illustrating a phase difference between a quasi-reference phase $\phi_0$ and a phase $\phi_2$ of an output of the frequency multiplier mpl20 in the device 2 by applying a remainder of $2\pi$ by a similar method as in FIG. 13. Hereinafter, explanation will be made by setting sample points at a time $t_C$ before a time $t_1$ and a time $t_D$ after the time $t_1$.

A phase difference detected at the time $t_C$ is $\text{mod}(\theta_{Lx2}-\theta_{Lox2}, 2\pi)$ as shown in equation (57) described above. A phase difference detected at the time $t_D$ is $$\phi_{Lt1\text{-}t2}(t_D)=\text{mod}(2\pi f_{IF2}t_D+\theta_{Lmx2(1)}-\theta_{LOx2}, 2\pi) \quad (64)$$

from equation (58). When the equation is simplified to omit mod, the phase detected at the time $t_C$ is set as $\phi_{Lt1}(t_C)$, and a difference between the two phase differences given from equation (58) and equation (64) is taken, equation (65) as follows is obtained.

$$\phi_{Lt1\text{-}t2}(t_D)-\phi_{Lt1}(t_C)=2\pi f_{IF2}t_D+\theta_{Lmx2(1)}-\theta_{Lx2} \quad (65)$$

From equation (40) and equation (65) described above, equation (66) as follows is obtained.

$$\Delta\theta_{LTR2}=\theta_{Lmx2(1)}-\theta_{Lx2}=\phi_{Lt1\text{-}t2}(t_D)-\phi_{Lt1}(t_C)-2\pi f_{IF2}t_D \quad (66)$$

From the output of the adder 4, $\phi_{Lt1\text{-}t2}(t_D)$ and $\phi_{Lt1}(t_C)$ in equation (66) described above are obtained. Accordingly, when the IF frequency $f_{IF2}$ and the time $t_D$ are defined, $\Delta\theta_{LTR2}$ can be obtained from equation (66) described above.

Note that equation (66) described above is obtained with a phase jump at a time of transition from a section before the time $t_1$ to a section from the times $t_1$ to $t_2$ as 0 [rad]. However, as is obvious from FIG. 12, the phase $\phi_{Lt1\text{-}t2}(t_D)$ at the time $t_D$ reflects a phase jump, and even when the phase jump is not 0 [rad], the initial phase fluctuation amount $\Delta\theta_{LTR2}$ is obtained by equation (66) described above.

In other words, in the present embodiment, the IF frequency $f_{IF2}$ and the time $t_D$ in the first reception section are defined, and the phase difference calculation unit A6 performs the operation including the operation of difference between the output of the adder A4 at the time $t_C$ in the output section by the initial setting and the output of the adder A4 at the time $t_D$, or the phase difference calculation unit A6 performs the operation including the difference between $\phi_2$-$\phi_0$ at the time $t_C$ and $\phi_2$-$\phi_0$ at the time $t_D$, whereby the fluctuation amount $\Delta\theta_{LTR2}$ of the initial phase can be detected.

Note that from the phase difference calculation unit A6 of the device 1 not illustrated, $\Delta\theta_{LTR1}$ is obtained by a similar method to the method described above.

Next, $\Delta\theta_{HTR2}$ is obtained. The distance measurement sequence of the low frequency and the distance measurement sequence of the high frequency in FIG. 3 only differ in frequency and start time of the sequence, and the time sequences in transmission and reception are same. In other words, when a difference in frequency is ignored, the phase difference between the quasi-reference phase of the device 2 and the phase of the output of the frequency multiplier mpl20 can be expressed by similar waveforms to the waveforms in FIG. 15 in the distance measurement sequence of the high frequency, and with respect to a start time t=0 [s] of the sequence of the low frequency, the start time can be offset by t=D [s] in the sequence of the high frequency.

Accordingly, equations in which L expressing the meaning of the low frequency is changed to H expressing the meaning of the high frequency, and the detection time of the phase is changed from the time $t_D$, to the time $D+t_D$ and is changed from the time $t_C$ to the time $D+t_C$ in equation (64) to equation (66) described above are established.

In other words, $\Delta\theta_{HTR2}$ can be expressed by equation (67) as follows that is obtained by transforming equation (66) described above by setting the phase of the output of the frequency multiplier mpl20 at the time $D+t_D$ as $\phi_{Ht1\text{-}t2}(D+t_D)$ and by setting the phase of the output of the frequency multiplier mpl20 at the time $D+t_C$ as $\phi_{Ht1}(D+t_C)$.

$$\Delta\theta_{HTR2}=\theta_{Hmx2(1)}-\theta_{Hx2}=\phi_{Ht1\text{-}t2}(D+t_C)-2\pi f_{IF2}t_D \quad (67)$$

Note that the IF frequency of the device 2 is almost unchanged regardless of whether the IF frequency is at a high frequency or at a low frequency, final terms of equation (66) and equation (67) have a same value.

The $\phi_{Ht1-t2}(D+t_D)$ and $\theta_{Ht1}(D+t_C)$ in equation (67) described above are obtained by the outputs of the adder 4. Accordingly, when the IF frequency $f_{IF2}$ and the time $t_D$ are defined, $\Delta\theta_{HTR2}$ can be obtained from equation (66) described above. Equation (67) is established regardless of a size of a phase jump at a time of transition from the section before the time $t_1$ to the section from the times $t_1$ to $t_2$.

In other words, in the present embodiment, the IF frequency $f_{IF2}$ and the time $t_D$ in the first reception section are defined, and the phase difference calculation unit A6 performs the operation including the operation of the difference between the output of the adder A4 at the time $D+t_C$ in the output section by the initial setting, and the output of the adder A4 at the time $D+t_D$, or the phase difference calculation unit A6 performs the operation including the difference between $\phi_2-\phi_0$ at the time $D+t_C$ and $\phi_2-\phi_0$ at the time $D+t_D$, whereby the fluctuation amount $\Delta\theta_{HTR2}$ of the initial phase can be detected.

Note that from the phase difference calculation unit A6 of the device 1 not illustrated, $\Delta\theta_{HTR1}$ is obtained by a similar method to the method described above.

In this way, it is possible to detect "the phase difference between the respective RF signals in the transmission section and the reception section that are continuous" that is the third phase difference. The phase detector phsdet of the device 2 outputs the first to the third phase differences that are obtained, that is, the fluctuation amounts of the initial phase to the phase calculator phscalc2.

(Distance Measurement Calculation)

The phase calculator phscalc2 may obtain $\theta_{LSUM}$ and $\theta_{HSUM}$ by using the outputs of the phase detector phsdet.

The $\theta_{LSUM}$ in equation (36) described above can be calculated by using the first to the third phase differences as shown in equation (42) described above.

Likewise, the $\theta_{HSUM}$ in equation (36) described above can also be calculated by using the first to the third phase differences as shown in equation (48) described above. The phase calculator phscalc2 outputs $\theta_{LSUM}$ and $\theta_{HSUM}$ that are calculated to the distance calculator dcalc2. The distance calculator dcalc2 obtains the delay $\tau_R$ by the operation of equation (36) described above from the output of the phase calculator phscalc2 and the signal S9, and further calculates a distance R.

Although the phase difference calculation unit A6 is described as performing the operation of the IF frequency $f_{IF2}$ and the time $t_D$ at the time of calculation of the above described third phase difference, the operation can be omitted as will be shown as follows. Equation (68) as follows expresses $\theta_{LSUM}-\theta_{HSUM}$ in the first term of equation (36) described above, from equation (42) and equation (48).

$$\theta_{LSUM}-\theta_{HSUM}=-2(\Delta\theta_{LTR1}-\Delta\theta_{HTR1})-2(\Delta\theta_{LTR2}-\Delta\theta_{HTR2})+2(\Delta\theta_{LTT2}-\Delta\theta_{HTT2})+(\Delta\theta_{HTT1}-\Delta\theta_{HTT1})-(\Delta\theta_{LRR2}-\Delta\theta_{HRR2}) \quad (68)$$

A first term and a second term of equation (68) each shows "the phase difference between the respective RF signals in the transmission section and the reception section that are continuous" that is the third phase difference, a third term and a fourth term each shows "the phase difference between the respective RF signals in the two transmission sections" that is the first phase difference, and a fifth term shows "the phase difference between the respective RF signals in the two reception sections" that is the second phase difference. In other words, the second term is a difference between "the phase difference between the respective RF signals in the transmission section and the reception section that are continuous" using the low frequency and "the phase difference between the respective RF signals in the transmission section and the reception section that are continuous" using the high frequency, in the device 2. When a difference between equation (66) and equation (67) is taken in order to obtain the difference, equation (69) as follows is obtained.

$$\Delta\theta_{LTR2}-\Delta\theta_{HTR2}=\phi_{Lt1-t2}(t_D)-\phi_{Lt1}(t_C)-\{\phi_{Ht1-t2}(D+t_D)-\phi_{Ht1}(D+T_C)\} \quad (69)$$

In equation (69), the term of the operation of the IF frequency $f_{IF2}$ and the time $t_D$ is cancelled out. In other words, it shows that when the predetermined time to with the frequency setting start as the reference is set at a fixed value, the difference of "the phase difference of the respective RF signals in the transmission section and the reception section that are continuous" that is the third phase difference can be obtained by the phase difference calculation unit A6 only obtaining the difference of the output phases of the adders A4 and A5.

In the device 1, it is also possible to obtain $\Delta\theta_{LTR1}-\Delta\theta_{HTR1}$ of the first term by a similar method.

Accordingly, in this case, the phase difference calculation unit A6 can perform only the phase difference operation, and the phase calculator phscalc2 can calculate $\theta_{LSUM}-\theta_{HSUM}$ by using an operation result of the phase difference calculation unit A6, and output a calculation result to the distance calculator dcalc2. In other words, in this case, a phase fluctuation detecting device is configured by using a function of the phase calculator phscalc2.

Note that as is obvious from FIG. 15, in the case where the frequency is not stabilized at the time $t_D$, the phase can be sampled at a time $t_D+T_{IF2}$ that is delayed by the IF period.

Figure 16:
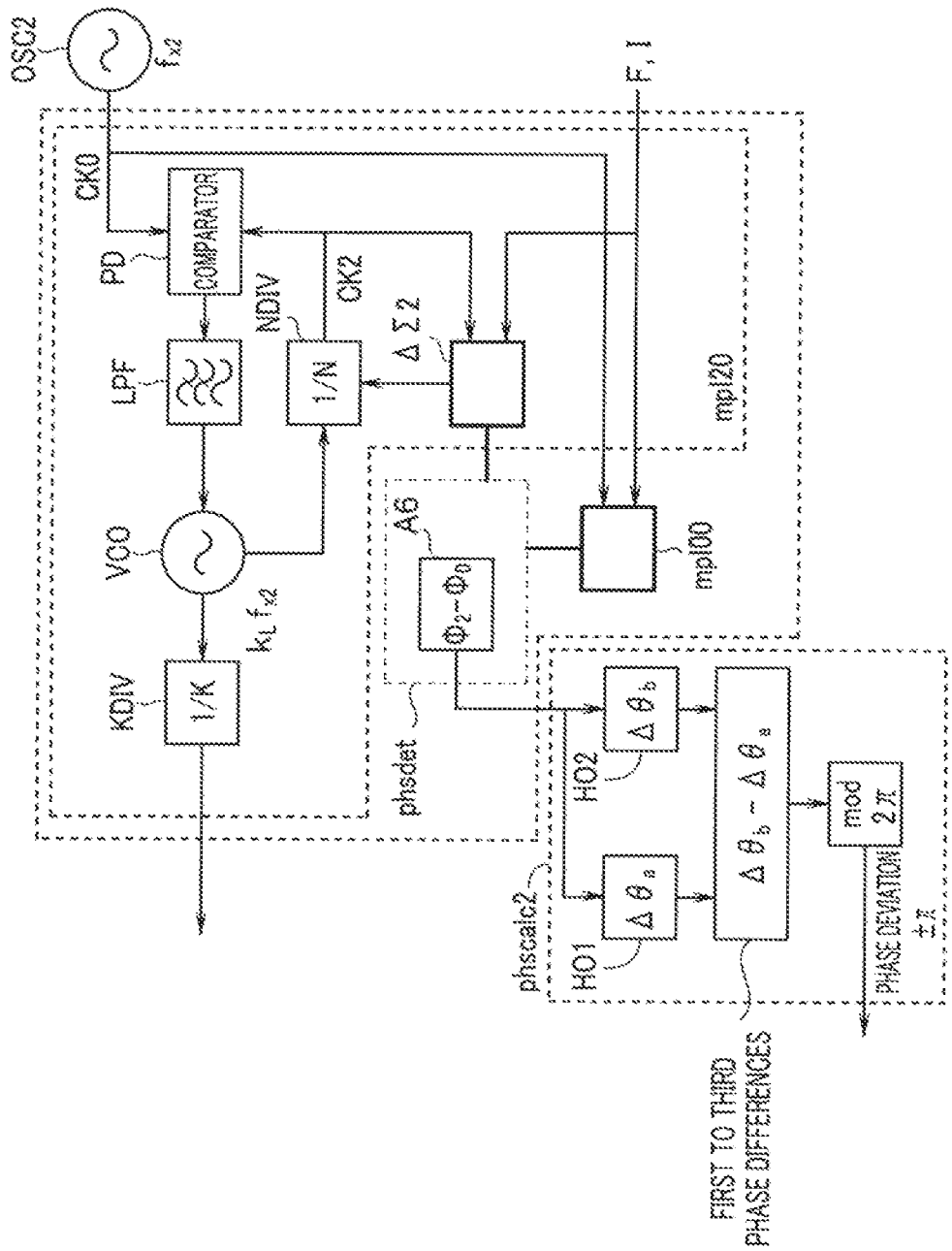
FIG. 16 is an explanatory diagram for explaining an operation of a phase calculator phscalc2.

FIG. 16 is an explanatory diagram for explaining an operation of the phase calculator phscalc2 in this case.

The phase calculator phscalc2 holds a plurality of hold circuits HO1, HO2, . . . that hold outputs of the phase detector phsdet. Note that FIG. 16 illustrates only the two hold circuits HO1 and HO2. The hold circuits HO1 and HO2 operate independently from each other by a control signal from the control device CN2, and hold outputs of the phase detector phsdet at the timing of a reverse phase of the reference clock CK0, for example. Note that the reason why the hold circuits perform hold at the timing of the reverse phase of the reference clock CK0 is that the timing of the reverse phase of the reference clock CK0 is the timing at which outputs of the frequency division number setting device $\Delta\Sigma2$ and the reference phase device mp100 are stabilized. An example in FIG. 16 shows an example in which the hold circuit HO1 holds a difference phase result $\Delta\theta_a$ from the phase difference calculation unit A6, and the hold circuit HO2 holds a difference phase result $\Delta\theta_b$.

For example, a value of $\phi_2(t_A)-\phi_0(t_A)$ shown in equation (54) is set as $\Delta\theta_a$, and a value of $\phi_2(t_B)-\phi_0(t_B)$ is set as $\Delta\theta_b$. The times $t_A$ and $t_B$ for holding are set according to the phases desired to be detected. For example, in the case of equation (54) described above for obtaining the first phase difference, the time $t_A$ is a time before the time $t_1$, and the time $t_B$ is a time between the time $t_2$ and the time $t_3$. Note that the time for this is set at a time at which the frequency is stabilized.

When the phase is observed in the section from the time $t_1$ to the time $t_2$ and the section from the time $t_3$ to the time $t_4$, in the transition of a transmission state before the time $t_1$, the reception section from the time $t_1$ to the time $t_2$, the transmission section from the time $t_2$ to the time $t_3$, and the reception section from the time $t_3$ to the time $t_4$, $t_A = t_{IF4}$, $t_B = t_{IFB}$ can be set. In other words, as a sampling point, a time limited to each IF period is set.

The calculated first to third phase differences are subjected to remainder calculation of $2\pi$, and are converted into data corresponding to radians. By using the data of the phase differences, a predetermined operation of correction or the like of the initial phase is performed.

Note that in the device 1, similar calculation of a deviation from the initial phase and correction of the initial phase are also possible.

In this way, in the present embodiment, it is possible to achieve the similar function to the function in the case of not changing the initial phase in the device that detects the phase of the signal by using the local oscillator by obtaining the fluctuation amount of the phase due to the initial phase change and the frequency change by adopting the reference phase device for obtaining the reference phase and obtaining the difference between the quasi-reference phase obtained from the output of the reference phase device and the phase of the output after resetting of the frequency, and correcting the phase according to the obtained fluctuation amount.

For example, when the present embodiment is applied to a distance measuring device that performs transmission and reception of signal wave signals between devices and performs distance measurement from a reception phase, and is a distance measuring device using a direct modulation method for a transmission unit and using a super heterodyne method for a reception unit, a fluctuation amount of an initial phase following a frequency change in a distance measurement sequence can be detected and corrected, and therefore accurate distance measurement is made possible from phase information.

(Modification 1)

Figure 17:
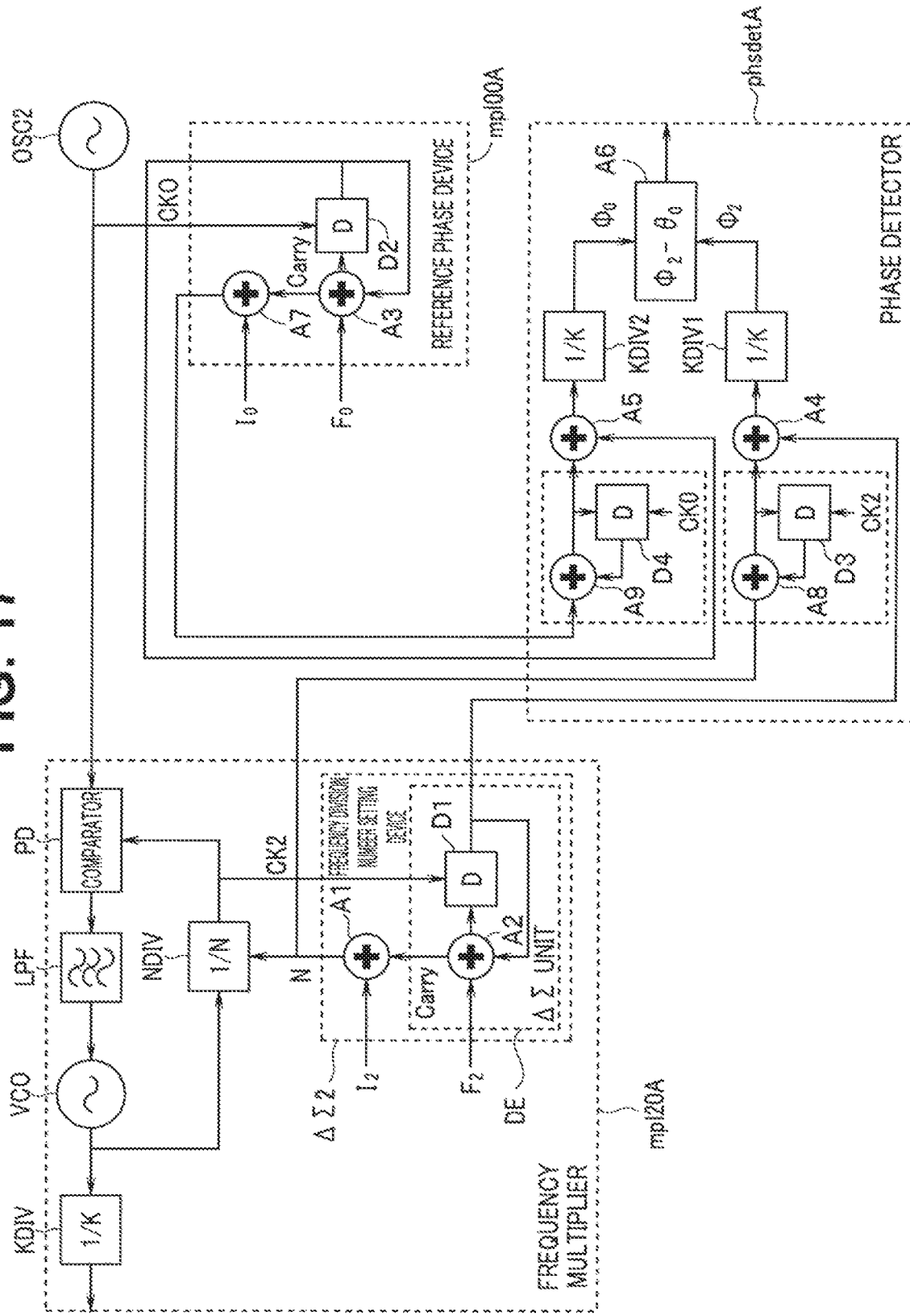
FIG. 17 is a circuit diagram illustrating a modification of a frequency multiplier mpl2.

FIG. 17 is a circuit diagram illustrating a modification of the frequency multiplier mpl2. In FIG. 17, same components as the components in FIG. 10 will be assigned with the same reference signs and explanation will be omitted.

FIG. 17 differs from FIG. 10 in that a frequency multiplier mpl20A, a reference phase device mpl00A, and a phase detector phsdetA are adopted respectively in place of the frequency multiplier mpl20, the reference phase device mpl00, and the phase detector phsdet. The frequency multiplier mpl20A differs from the frequency multiplier mpl20 in that a frequency divider KDIV configured to frequency-divide an output of a voltage-controlled oscillator VCO of the frequency multiplier mpl20A by K is added, and a frequency division number N from an adder A1 is outputted in place of Carry from the adder A2. In the former, an integrator including adders A4 and A8, and a delay device D3, and an integrator including adders A5 and A9, and a delay device D4 are also added in the phase detector phsdetA.

The reference phase device mpl00A differs from the reference phase device mpl00 in that an adder A7 that adds up Carry of an adder A3 and an integer value $I_0$ is added, and an output of the adder A7 is outputted in place of Carry from the adder A3.

In general, in a wireless device, in order to respond to a plurality of systems having different carrier frequencies, an output of the voltage-controlled oscillator VCO may be frequency-divided according to the system. In FIG. 17, mpl20A shows a configuration in a case of frequency-dividing the output of the voltage-controlled oscillator VCO by K.

In the system that frequency-divides the output of the voltage-controlled oscillator VCO by K, a signal after frequency-division by K is used for a single wave signal for use in distance measurement. On the other hand, an output of a delay device D1 of a $\Delta\Sigma$ unit DE shows a phase of the output of the voltage-controlled oscillator VCO before frequency-division by K, and therefore in order to match the phase of the output of the delay device D1 with a phase of the signal after frequency-division by K, it is necessary to frequency-divide the output of the delay device D1 by K. The same applies to the output of the reference phase device mpl00A, and for this reason, the output of the adder A4 is given to a frequency divider KDIV1, whereas the output of the adder A5 is given to a frequency divider KDIV2. The frequency dividers KDIV1 and KDVI2 respectively frequency-divide inputted signals by K. An output of the frequency divider KDIV1 is outputted to a phase difference calculation unit A6 as $\phi_2$ representing an output phase of the frequency multiplier mpl20A, and an output of the frequency divider KDIV2 is outputted to the phase difference calculation unit A6 as a reference phase $\phi_0$.

In the example in FIG. 10, the information on the integer value $I_2$ in the rational number multiple is omitted in the remainder operation for obtaining the phase $\phi_2$, and therefore $\phi_2$ is obtained by using an output of the delay device D1 corresponding to the decimal value $F_2$ and Carry. However, when frequency-division by K is applied to the addition result of Carry and the output of the delay device D1, only a phase of $360 \times 2[°]/K$ can be expressed, and there is a possibility that an error occurs to a phase difference.

Therefore, in an example in FIG. 17, in order to match $\phi_2$ with the phase of the signal after frequency-division by K, information on a rational number multiple, that is, information on N based on the integer value $I_2$ and Carry is necessary. Therefore, the output N of the adder A1 of the frequency multiplier mpl20A is given to the integrator configured by the adder A8 and the delay device D3.

The delay device D3 takes in an output of the adder A8 and outputs the output to the adder A8, by a clock CK2. The adder A8 adds up N from the adder A1 and the output of the delay device D3, and outputs an addition result to the adder A4. In this way, in the adder A4, the phase corresponding to the output of the voltage-controlled oscillator VCO is obtained. The output of the adder A4 also takes into account the integer value $I_2$, and is frequency-divided by K in the frequency divider KDIV1, and thereby $\phi_2$ representing the phase of the output of the frequency divider KDIV is obtained.

Likewise, in the reference phase device mpl00A, an output of the adder A7 is given to the integrator configured by the adder A9 and the delay device D4. The delay device D4 takes in an output of the adder A9 and outputs the output to the adder A9 by the reference clock CK0. The adder A9 adds up the output of the adder A7 and an output of the delay device D4, and outputs an addition result to the adder A5. In this way, in the adder A5, a quasi-reference phase corresponding to an output of the voltage-controlled oscillator VCO at a time of an initial setting is obtained. An output of the adder A5 also takes into account the integer value $I_0$, and is frequency-divided by K in the frequency divider KDIV2, and thereby a quasi-reference phase $\phi_0$ representing a phase of an output of the frequency divider KDIV at a time of an initial setting is obtained.

In this way, according to the present modification, the phase $\phi_2$ corresponding to the output after frequency-division by K and the quasi-reference phase $\phi_0$ can be obtained.

From another perspective, FIG. 17 is an original configuration, and FIG. 10 is a simplified configuration. Further, in FIG. 10, the example in which the two integrators of integer values are provided in the phase detector is explained, but the integrators may be disposed in the frequency multiplier and the reference phase device.

Instead of the output of the adder A1, Carry of the adder A2 and $I_2$ are outputted from the frequency multiplier mpl20A, and an addition result of both may be given to the adder A8 in the phase detector phsdetA. Likewise, instead of the output of the adder A7, Carry of the adder A3 and $I_0$ are outputted from the reference phase device mpl00A, and an addition result of both may be given to the adder A9 in the phase detector phsdetA.

(Modification 2)

Figure 18A:
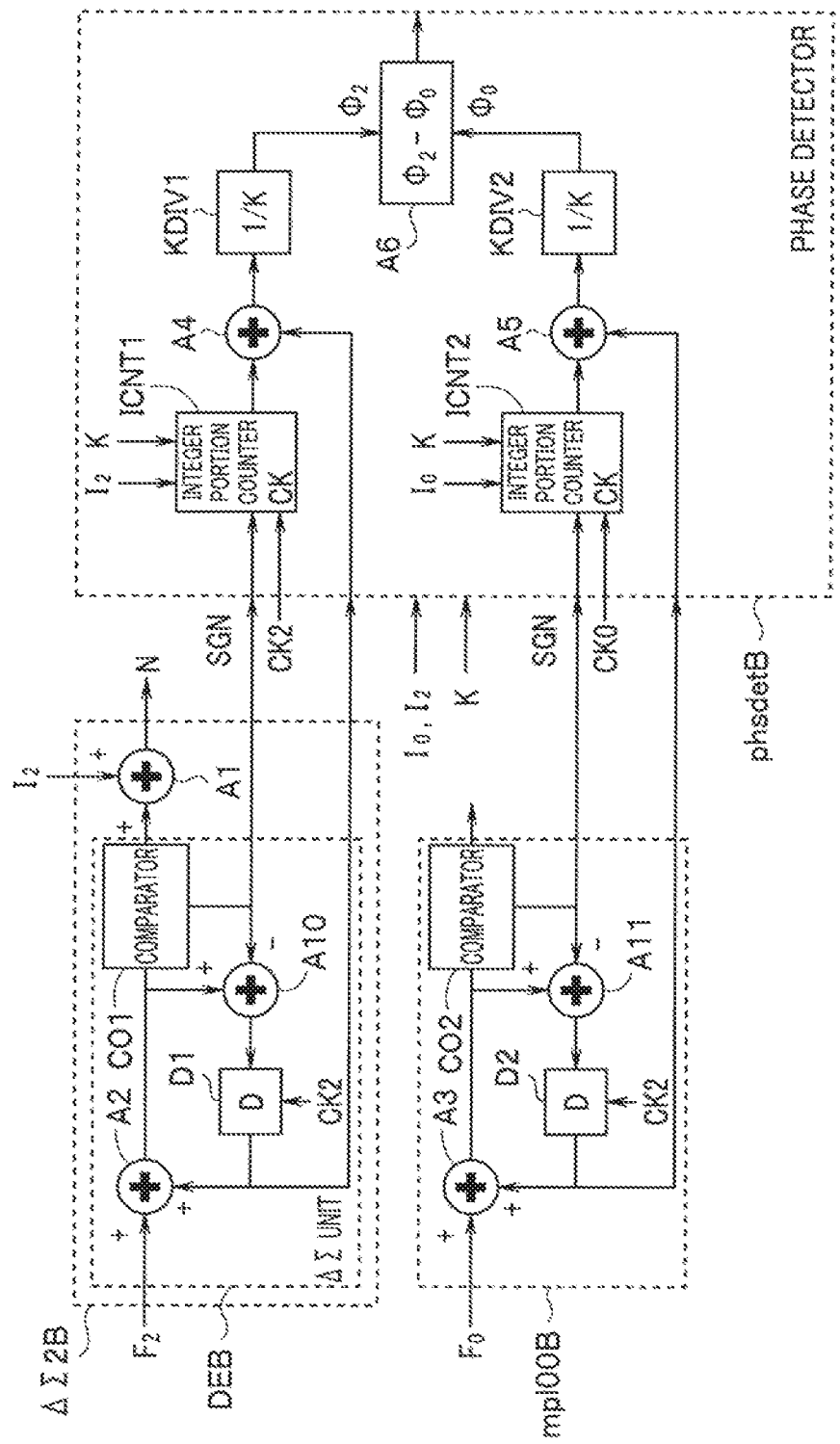
FIG. 18A is a circuit diagram illustrating a modification of a circuit illustrated in FIG. 17.

FIG. 18A is a circuit diagram illustrating a modification of the circuit illustrated in FIG. 17. FIG. 18A differs from FIG. 17 in that in place of the ΔΣ unit DE in the frequency multiplier mpl20A, the reference phase device mpl00A and the phase detector phsdetA, a ΔΣ unit DEB, a reference phase device mpl00B and a phase detector phsdetB are adopted respectively. Note that in FIG. 18A, components other than the ΔΣ unit DE in the frequency multiplier mpl20A are similar to the components in FIG. 17, and illustration of such components will be omitted.

An example in FIG. 18A adopts the ΔΣ unit DEB including not only an integrator by an adder A2 and a delay device D1 but also a comparator CO1 and a subtractor A10, as the ΔΣ unit in a frequency division number setting device ΔΣ2B. An output of the adder A2 is given to the subtractor A10 and the comparator CO1. The comparator CO1 outputs, for example, three values of +1, 0 and −1 as SGN by comparison of the output of the adder A2 and a predetermined threshold. An output (SGN) of the comparator CO1 is given to the subtractor A10 and an adder A1.

Figure 18B:
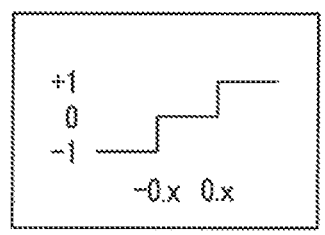
FIG. 18B is an explanatory diagram for explaining an operation of a comparator CO1.

FIG. 18B is an explanatory diagram for explaining an operation of the comparator CO1. In an example in FIG. 18B, −0.x and +0.x are adopted as predetermined thresholds. Note that x is 5, for example. In this case, SGN is 0 when the output of the adder A2 is larger than −0.5 and is smaller than +0.5, SGN is when the output of the adder A2 is 0.5 or less, and SGN is 1 when the output of the adder A2 is +0.5 or more.

The subtractor A10 subtracts the output (SGN) of the comparator CO1 from the output of the adder A2 and outputs a subtraction result to the delay device D1. The delay device D1 outputs the output of the subtractor A10 to the adder A2 at the timing of the clock CK2. In the example of FIG. 17, 0 or 1 of the two values is outputted from the adder A2, and is added to $I_2$ in the adder A1. On the other hand, in FIG. 18A, the comparator CO1 outputs SGN of three values of −1, 0 and +1, and therefore has a reduction effect of quantization noise. Note that a secondary or higher ΔΣ unit may be adopted, and in this case, a reduction effect of quantization noise can be further enhanced.

The output of the comparator CO1 corresponds to Carry from the adder A2 in FIG. 17, and has a value that is added to an integer value of a rational number multiple. The output of the delay device D1 corresponds to a phase of the output of the voltage-controlled oscillator VCO, and when an output of a value corresponding to Carry is generated from the comparator CO1, a difference phase of an input and an output of the comparator CO1 is extracted by the subtractor A10. In other words, the output of the delay device D1 shows a phase in one period of the output of the voltage-controlled oscillator VCO, and is supplied to the adder A4 as in FIG. 17. SGN from the comparator CO1 is supplied to an integer portion counter ICNT1 corresponding to the integrator by the adder A8 and the delay device D3 in FIG. 17.

A configuration of a reference phase device mpl00B is also similar to the configuration of the ΔΣ unit DEB. In other words, an output of an adder A3 is given to a subtractor A11 and a comparator CO2. The comparator CO2 outputs three values of, for example, +1, 0, and −1 as SGN by comparison of the output of the adder A3 and a threshold. An output (SGN) of the comparator CO2 is given to the subtractor A11 and an adder A7 (not illustrated in FIG. 18A). An operation of the comparator CO2 is similar to the operation of the comparator CO1. The subtractor A11 subtracts the output (SGN) of the comparator CO2 from the output of the adder A3 to output a subtraction result to a delay device D2. The delay device D2 outputs an output of the subtractor A11 to the adder A3 at the timing of a reference clock CK0.

By the configuration, the delay device D2 of the reference phase device mpl00B supplies a quasi-reference phase corresponding to a phase of an output of the voltage-controlled oscillator VCO in an initial setting to an adder A5 as in FIG. 17. SGN from the comparator CO2 is supplied to an integer portion counter ICNT2 corresponding to the integrator by the adder A9 and the delay device D4 in FIG. 17.

Figure 19:
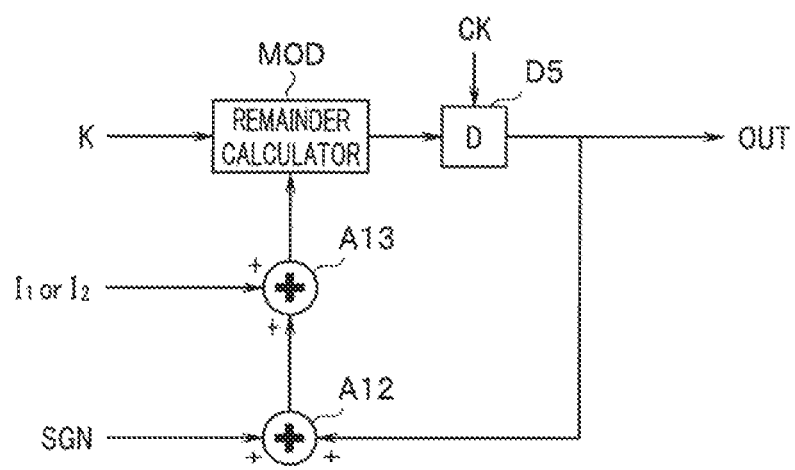
FIG. 19 is a circuit diagram illustrating one example of a specific configuration of integer portion counters ICNT1 and ICNT2 in FIG. 18A.

FIG. 19 is a circuit diagram illustrating one example of a specific configuration of each of the integer portion counters ICNT1 and ICNT2 in FIG. 18A. The integer portion counters ICNT1 and ICNT2 are of a same configuration as each other, a delay device D5 corresponds to the delay device D3 or the delay device D4 in FIG. 17, and adders A12 and A13 correspond to the adder A1 and A8, or the adder A7 and A9 in FIG. 17.

Now, the circuit in FIG. 19 is described as the integer portion counter ICNT1. The adders A12 and A13 perform addition of $I_2$ and SGN from the comparator CO1. An addition result of the adder A13 is given to the delay device D5 via a remainder calculator MOD. The delay device D5 gives an output of the remainder calculator MOD to the adder A12 at the timing of the clock CK2. In this way, a similar output to the output of the adder A8 in FIG. 17 is obtained from the delay device D5.

Note that in the integer portion counter ICNT2, a similar operation to the operation of the integer portion counter ICNT1 is performed, and a similar output to the output of the adder A9 in FIG. 17 is obtained from the delay device D5. Note that in the integer portion counter ICNT1, the delay device D5 operates on the reference clock CK0.

The remainder calculator MOD performs remainder calculation of K to the output of the adder A13, and outputs a calculation result to the delay device D5. An output of the delay device D5 of the integer portion counter ICNT1 is supplied to the adder A4, and an output of the delay device D5 of the integer portion counter ICNT2 is supplied to the adder A5.

Outputs of the adders A4 and A5 are respectively supplied to the frequency dividers KDIV1 and KDIV2 and are frequency-divided by K. A maximum output of the delay device D5 corresponding to one period (2π) of the phases $\phi_2$ and $\phi_0$ from the frequency dividers KDIV1 and KDIV2 is K. The remainder calculator MOD performs remainder calculation of K to the output of the adder A13, and thereby remainder calculation of 2π is performed to the phases $\phi_2$ and $\phi_0$. Thereby, it is possible to reduce an amount of data handled in a circuit at a subsequent stage to the remainder calculator MOD and reduce a circuit scale.

In this way, in the modification, it becomes possible to enhance accuracy of the oscillation output of the local oscillator, and it becomes possible to reduce the amount of data handled in the circuit at the subsequent stage to reduce the circuit scale.

(Modification 3)

Figure 20:
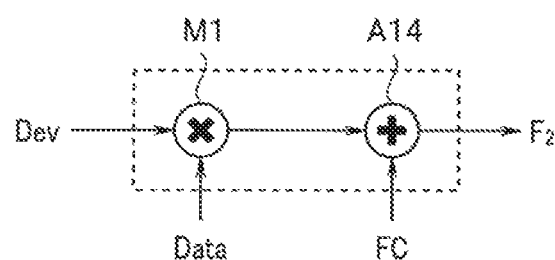
FIG. 20 is a circuit diagram illustrating one example of a circuit that generates $F_2$.

FIG. 20 is a circuit diagram illustrating one example of a circuit that generates $F_2$. A frequency setting code FC for specifying a decimal value $F_2$ of a rational number multiple is supplied to an adder 14. Note that the frequency setting code FC is set by a communication control unit not illustrated configured to control communication between a device 1 and a device 2, for example. Note that the communication control unit may be included in operation devices CA1 and CA2 of the devices 1 and 2.

In the modification, it is possible to transmit not only a distance measurement signal (single wave signal), but also an FSK (frequency shift) modulation signal. A frequency deviation signal Dev that defines a frequency shift in FSK modulation is given to a modulator M1. Data that is transmitted by FSK modulation is also given to the modulator M1, and the modulator M1 performs FSK modulation to the data Data according to the frequency deviation signal Dev, and outputs a modulated signal to the adder A14. The adder A14 outputs a result of adding up the frequency setting code FC and the modified signal as a decimal value $F_2$.

According to the configuration as above, the output of the voltage-controlled oscillator VCO also changes in phase as the voltage-controlled oscillator VCO changes in frequency by FSK modulation. In this case, as described above, correction of the phase is possible by using a quasi-reference phase. As a result, even when communication is switched from FSK communication to communication for distance measurement, accurate distance measurement is possible from a phase of a reception signal.

(Modification 4)

Figure 21:
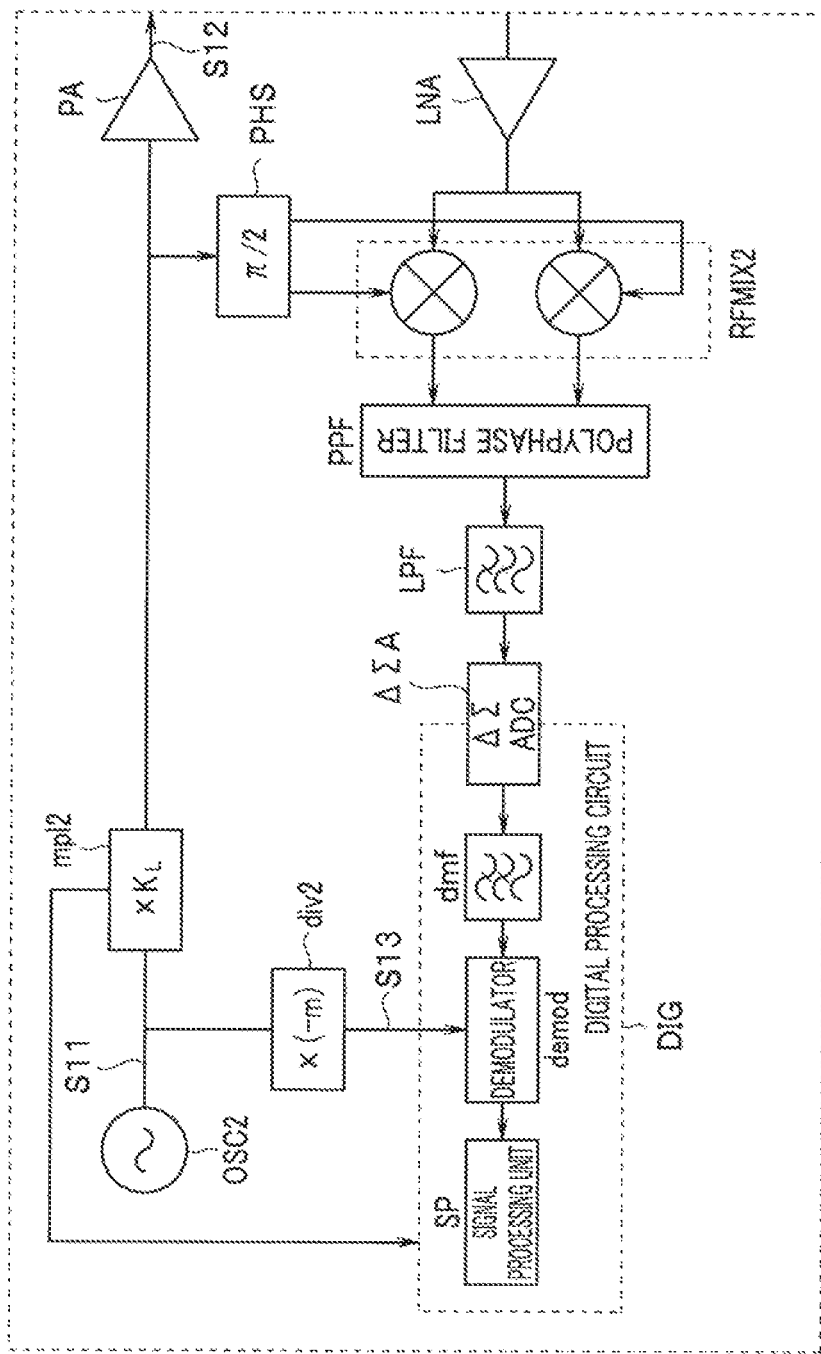
FIG. 21 is a block diagram illustrating a modification.

FIG. 21 is a block diagram illustrating a modification. In FIG. 21, same components as the components in FIG. 9 will be assigned with same reference signs, and explanation will be omitted. FIG. 21 illustrates the wireless unit in FIG. 9 more specifically. FIG. 21 illustrates configuration corresponding to a device 2, but specific components of a device 1 are also similar to the components in FIG. 21, and illustration and explanation will be omitted for the specific components of the device 1.

Though omitted in FIG. 1, FIG. 9 and the like, an output of mpl2 is outputted via a power amplifier PA. The power amplifier PA performs power amplification of the output of mpl2 to give the output to an antenna not illustrated. In this way, a radio signal based on the output of mpl2 is outputted from the antenna.

The radio signal received by the antenna is inputted to a low noise amplifier LNA via an RF (high frequency) filter not illustrated. The low noise amplifier LNA performs low noise amplification of a reception signal, and thereafter outputs the reception signal to RFMIX2. RFMIX2 is given a LO signal for frequency conversion from a phase shifter PHS. The phase shifter PHS shifts a phase of an output of mpl2 by π/2, and gives two LO signals shifted in phase by π/2 from each other to RFMIX2. RFMIX2 performs frequency conversion of the reception signal of the low noise amplifier LNA to convert the reception signal into IF signals by using the LO signals from the phase shifter PHS, and gives the IF signals to a polyphase filter PPF.

The polyphase filter PPF restricts either a positive frequency component or a negative frequency component, and takes out a desired signal as an IF signal. An output signal of the polyphase filter PPF is given to a low pass filter LPF to be band-limited, and thereafter is given to a ΔΣ type AD converter ΔΣA configuring a digital processing circuit DIG. Note that the digital processing circuit DIG mainly configures IFMIX2 and the operation device CA2 in FIG. 9. The ΔΣ type AD converter ΔΣA converts an inputted signal into a digital signal, and thereafter outputs the digital signal to a decimation filter dmf. The ΔΣ type AD converter ΔΣA oversamples the input signal and takes in the input signal to obtain high resolution. Note that a clock of the ΔΣ type AD converter ΔΣA is generated from an output of OSC2 (not illustrated).

The decimation filter dmf limits a band of an output of the ΔΣ type AD converter ΔΣA to a low range and outputs the output of the ΔΣ type AD converter ΔΣA to a demodulator demod. The demodulator demod demodulates an IF signal by using an output of div2, and outputs a distance measurement signal of a base band to a signal processing unit SP. The signal processing unit SP is also given an output of a phase detector phsdet of mpl2.

The signal processing unit SP configures the phase calculator phscalc2 and the distance calculator dcalc2 in FIG. 9. The signal processing unit SP corrects a fluctuation amount of an initial phase following a frequency change to the phase information and amplitude information obtained by demodulation, and performs a distance measurement operation. Thereby, accurate distance measurement is possible.

In this way, in the present modification, the fluctuation in the initial phase that occurs in the distance measuring device using a specific wireless unit is corrected, and accurate distance measurement is possible.

(Modification 5)

Figure 22:
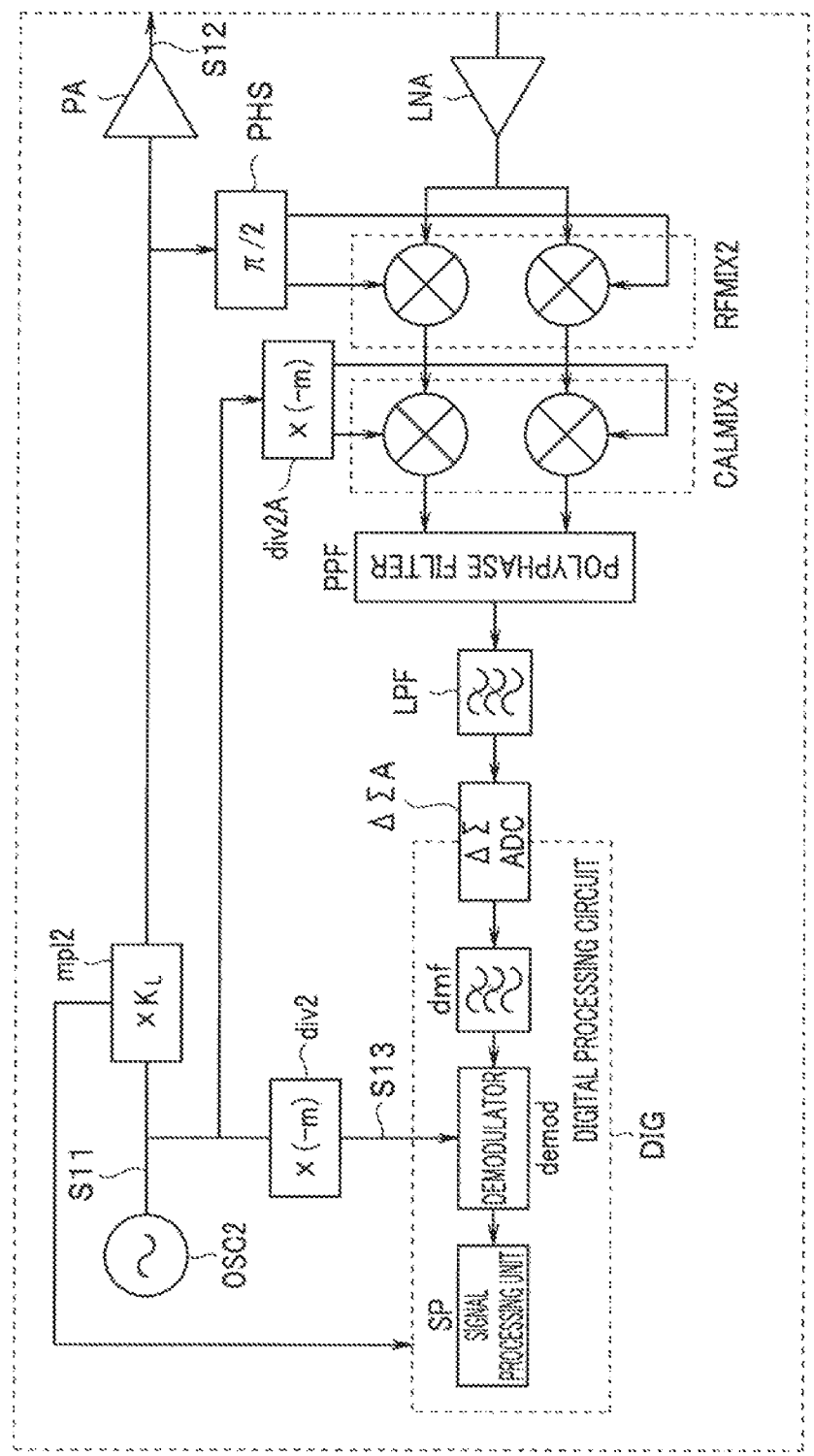
FIG. 22 is a block diagram illustrating a modification.

FIG. 22 is a block diagram illustrating a modification, and illustrates a configuration including a filter delay calibration function in the wireless unit in FIG. 21. In FIG. 22, same components as the components in FIG. 21 will be assigned with same reference signs, and explanation will be omitted. Note that the device 1 can also be configured similarly to FIG. 22.

In distance measurement by a phase detection method, a distance is measured by detecting a propagation phase delay corresponding to a propagation distance of a distance measurement signal. At this time, in order to obtain the distance between two devices accurately, it is necessary to separate delays inherent in respective devices and a propagation delay between the two devices. Of delays inherent in the wireless units and the devices themselves, for example, a delay due to RF filter not illustrated in FIG. 21 and FIG. 22 is relatively large, and due to an influence of the delay, a large distance measurement error may occur.

Therefore, in a device in FIG. 22, a propagation distance between two devices is obtained by measuring a delay of the RF filter, and subtracting a delay phase of the delay from a phase of a reception signal. For example, at a transmission time and a reception time, a common RF filter is adopted as the RF filter that allows a band of a distance measurement signal to pass through. At a time of distance measurement, the RF filter limits a band of an output of a power amplifier PA to supply the output of the power amplifier PA to an antenna, and limits a band of a reception signal from the antenna to supply the reception signal to a low noise amplifier LNA. In the device in FIG. 22, a configuration like this is provided with a first feedback loop not illustrated that gives a transmission signal from the power amplifier PA to the low noise amplifier LNA via the RF filter at a calibration time, and a second feedback loop not illustrated that gives a transmission signal from the power amplifier PA to the low noise amplifier LNA without passing the transmission signal through the RF filter.

According to the configuration like this, it is possible to measure a delay due to the RF filter by obtaining a difference between a delay amount of a reception signal in a case where a transmission signal is received via the first feedback loop, and a delay amount of a reception signal in a case where a transmission signal is received via the second feedback loop, in a signal processing unit SP. Note that since the delay amount of the RF filter has a temperature characteristic, calibration measuring a filter delay is performed at the time of distance measurement.

Since a signal frequency does not change in the first and the second feedback loops, frequencies of the transmission signal outputted from the power amplifier PA and the reception signal received in the low noise amplifier LNA are same. Accordingly, at the time of calibration, the output of RFMIX2 becomes DC (direct current). Consequently, when the output of RFMIX2 is directly given to a polyphase filter PPF, a signal attenuation amount in the polyphase filter PPF is large, and measurement of the signal delay becomes difficult.

Therefore, in the present modification, div2A of a similar configuration to the configuration of div2 and a calibration mixer CALMIX2 are provided. The div2A generates two LO signals having a same frequency as an IF frequency and phases shifted by $\pi/2$ from each other, and gives the LO signals to the calibration mixer CALMIX2. The calibration mixer CALMIX2 converts outputs of RFMIX2 into the IF frequency by using the LO signals from div2A, and thereafter gives the outputs to the polyphase filter PPF.

Thereby, in the polyphase filter PPF, an IF signal at a sufficient level can be outputted, and in the signal processing unit SP, a delay in the filter can be reliably detected.

In this way, in the present modification, a fluctuation in the initial phase is corrected, and accurate distance measurement can be enabled, even in the distance measuring device using a specific wireless unit including the filter delay calibration function.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A phase correcting device, comprising:
a local oscillator that includes a PLL configured to generate a local oscillation signal based on a reference clock, and is configured to give the local oscillation signal to a device configured to detect a phase of an inputted signal;
a first phase detector included in the PLL, and configured to detect a phase of the local oscillation signal to output the phase of the local oscillation signal;
a reference phase device configured to generate a quasi-reference phase corresponding to a reference phase of the local oscillation signal at a time of an initial setting of the local oscillator to output the quasi-reference phase, based on the reference clock;
a second phase detector configured to detect a fluctuation amount of a phase of the local oscillator, based on the phase detected by the first phase detector and the quasi-reference phase; and
a correction circuit configured to correct the phase of the inputted signal by using a detection result of the second phase detector.

2. The phase correcting device according to claim 1, wherein the first phase detector includes a first phase integrator configured to set a frequency division number to a frequency divider with an output of the frequency divider configuring the PLL as a clock input, the reference phase device includes a second phase integrator with the reference clock as a clock input, and the second phase detector includes a first difference device configured to obtain the fluctuation amount of the phase of the local oscillator based on a difference between an output of the first phase integrator and an output of the second phase integrator.

3. The phase correcting device according to claim 2, wherein the first phase integrator includes a feedback loop configured by a first adder and a first delay device, in which the first adder is given a fractional input and the first delay device is given an output of the frequency divider as a clock input, and outputs carry generated from the first adder and an output of the first delay device as a detection result of the phase of the local oscillation signal, and
the second phase integrator includes a feedback loop configured by a second adder and a second delay device, in which the second adder is given a fractional input in the initial setting of the local oscillator, and the second delay device is given the reference clock as a clock input, and outputs carry generated from the second adder and an output of the second delay device as the quasi-reference phase.

4. The phase correcting device according to claim 3, wherein the second phase detector detects a fluctuation amount of the phase of the local oscillator based on a difference between a first addition result of the carry generated from the first adder and the output of the first delay device, and a second addition result of the carry generated from the second adder and the output of the second delay device.

5. The phase correcting device according to claim 3, wherein the local oscillator includes a K frequency divider configured to frequency-divide an output of the PLL by K,
the second phase detector comprises
a first integer integrator configured to integrate an integer value for determining a frequency division number of the frequency divider that is used in the first phase detector, a third adder configured to add up an output of the first integer integrator and the output of the first delay device, and a first divider configured to divide an output of the third adder by K, and
a second integer integrator configured to integrate an integer value for determining a frequency division number in an initial setting of the frequency divider that is used in the reference phase device, a fourth adder configured to add up an output of the second integer integrator and an output of the second delay device, and a second divider configured to divide an output of the fourth adder by K, and
the first difference device obtains the fluctuation amount of the phase of the local oscillator based on a difference between an output of the first divider and an output of the second divider.

6. A distance measuring device configured to calculate a distance based on carrier phase detection, comprising an operation device configured to calculate a distance between a first device and a second device based on phase information obtained from the first device and the second device, at least one of which is movable,
wherein the first device comprises
a first local oscillator that includes a first PLL configured to generate a first local oscillation signal based on a first reference clock, and is configured to output the first local oscillation signal,
a first transmitter configured to transmit two or more first carrier signals by using an output of the first local oscillator by a direct modulation method,
a first receiver configured to receive two or more second carrier signals by using an output of the first local oscillator by a heterodyne method,
a first output phase detector included in the first PLL, and configured to detect a phase of the first local oscillation signal to output the phase of the first local oscillation signal,
a first reference phase device configured to generate a first quasi-reference phase corresponding to a first reference phase of the first local oscillation signal at a time of an initial setting of the first local oscillator to output the first quasi-reference phase, based on the first reference clock, and
a first fluctuation phase detector configured to detect a first fluctuation amount of a phase of the first local oscillator, based on a phase detected by the first output phase detector and the first quasi-reference phase,
the second device comprises
a second local oscillator that includes a second PLL configured to generate a second local oscillation signal based on a second reference clock, and is configured to output the second local oscillation signal,
a second transmitter configured to transmit the two or more second carrier signals by using an output of the second local oscillator by a direct modulation method;
a second receiver configured to receive the two or more first carrier signals by using an output of the second local oscillator by a heterodyne method,
a second output phase detector included in the second PLL, and configured to detect a phase of the second local oscillation signal to output the phase of the second local oscillation signal,
a second reference phase device configured to generate a second quasi-reference phase corresponding to a second reference phase of the second local oscillation signal at a time of an initial setting of the second local oscillator to output the second quasi-reference phase, based on the second reference clock, and
a second fluctuation phase detector configured to detect a second fluctuation amount of a phase of the second local oscillator, based on a phase detected by the second output phase detector, and the second quasi-reference phase, and
the operation device performs calculation of the distance based on a phase detection result obtained by reception of the first and the second carrier signals by the first receiver and the second receiver, and the first and the second fluctuation amounts detected by the first fluctuation phase detector and the second fluctuation phase detector.

7. The distance measuring device according to claim 6, wherein the first transmitter comprises a first power amplifier configured to amplify the first local oscillation signal, the second transmitter comprises a second power amplifier configured to amplify the second local oscillation signal, the first receiver comprises a first low noise amplifier configured to amplify a reception signal, a first 90 degrees phase shifter configured to generate a quadrature signal by using the first local oscillation signal, a first quadrature demodulator configured to demodulate an output of the first low noise amplifier by using an output of the first 90 degrees phase shifter, a first polyphase filter configured to remove an image signal of an output of the first quadrature demodulator, a first low pass filter configured to band-limit an output of the first polyphase filter, a first $\Delta\Sigma AD$ converter configured to convert an output of the first low pass filter into a digital signal, a first decimation filter configured to limit a band of an output of the first $\Delta\Sigma AD$ converter, and a first demodulator configured to demodulate an output of the first decimation filter by using a first clock generated from the first reference clock, and the second receiver comprises a second low noise amplifier configured to amplify a reception signal, a second 90 degrees phase shifter configured to generate a quadrature signal by using the second local oscillation signal, a second quadrature demodulator configured to demodulate an output of the second low noise amplifier by using an output of the second 90 degrees phase shifter, a second polyphase filter configured to remove an image signal of an output of the second quadrature demodulator, a second low pass filter configured to band-limit an output of the second polyphase filter, a second $\Delta\Sigma AD$ converter configured to convert an output of the second low pass filter into a digital signal, a second decimation filter configured to limit a band of an output of the second $\Delta\Sigma AD$ converter, and a second demodulator configured to demodulate an output of the second decimation filter by using a second clock generated from the second reference clock.

8. The distance measuring device according to claim 6, wherein the first output phase detector includes a first output phase integrator configured to set a frequency division number to the first frequency divider with an output of a first frequency divider configuring the first PLL as a clock input, the first reference phase device includes a first quasi-reference phase integrator with the first reference clock as a clock input, the first fluctuation phase detector includes a first difference device configured to obtain a fluctuation amount of a phase of the first local oscillator based on a difference between an output of the first output phase integrator and an output of the first quasi-reference phase integrator, the second output phase detector includes a second output phase integrator configured to set a frequency division number to the second frequency divider with an output of a second frequency divider configuring the second PLL as a clock input, the second reference phase device includes a second-quasi reference phase integrator with the second reference clock as a clock input, and the second fluctuation phase detector includes a second difference device configured to obtain a fluctuation amount of a phase of the second local oscillator based on a difference between an output of the second output phase integrator and an output of the second quasi-reference phase integrator.

9. The distance measuring device according to claim 7,
wherein the first output phase detector includes a first output phase integrator configured to set a frequency division number to the first frequency divider with an output of a first frequency divider configuring the first PLL as a clock input, the first reference phase device includes a first quasi-reference phase integrator with the first reference clock as a clock input, the first fluctuation phase detector includes a first difference device configured to obtain a fluctuation amount of a phase of the first local oscillator based on a difference between an output of the first output phase integrator and an output of the first quasi-reference phase integrator, the second output phase detector includes a second output phase integrator configured to set a frequency division number to the second frequency divider with an output of a second frequency divider configuring the second PLL as a clock input, the second reference phase device includes a second-quasi reference phase integrator with the second reference clock as a clock input, and the second fluctuation phase detector includes a second difference device configured to obtain a fluctuation amount of a phase of the second local oscillator based on a difference between an output of the second output phase integrator and an output of the second quasi-reference phase integrator.

10. A phase fluctuation detecting device, comprising:
a local oscillator that includes a PLL configured to generate a local oscillation signal based on a reference clock, and is configured to give the local oscillation signal to a device configured to detect a phase of an inputted signal;

a first phase detector included in the PLL, and configured to detect a phase of the local oscillation signal to output the phase of the local oscillation signal;

a reference phase device configured to generate a quasi-reference phase corresponding to a reference phase of the local oscillation signal at a time of an initial setting of the local oscillator to output the quasi-reference phase, based on the reference clock; and a second phase detector configured to detect a fluctuation amount of a phase of the local oscillator, based on a phase detected by the first phase detector and the quasi-reference phase.

11. A phase correction method, comprising:
giving a local oscillation signal to a device configured to detect a phase of an inputted signal, from a local oscillator including a PLL configured to generate a local oscillation signal based on a reference clock;

detecting a phase of the local oscillation signal by a first phase detector included in the PLL;

generating a quasi-reference phase corresponding to a reference phase of the local oscillation signal at a time of an initial setting of the local oscillator to output the quasi-reference phase, based on the reference clock, by a reference phase device, detecting a fluctuation amount of a phase of the local oscillator based on the phase detected by the first phase detector and the quasi-reference phase by a second phase detector, and correcting the phase of the inputted signal by using a detection result of the second phase detector.

* * * * *